(12) United States Patent
Fujiwara et al.

(10) Patent No.: US 10,056,154 B2
(45) Date of Patent: Aug. 21, 2018

(54) APPARATUSES AND METHODS FOR FLEXIBLE FUSE TRANSMISSION

(71) Applicant: Micron Technology, Inc., Boise, ID (US)

(72) Inventors: Yoshinori Fujiwara, Tokyo (JP); Kenji Yoshida, Chofu (JP); Minoru Someya, Chofu (JP); Hiromasa Noda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/668,586

(22) Filed: Aug. 3, 2017

(65) Prior Publication Data

US 2018/0075920 A1    Mar. 15, 2018

Related U.S. Application Data

(63) Continuation of application No. 15/493,772, filed on Apr. 21, 2017, which is a continuation of application
(Continued)

(51) Int. Cl.
*G11C 7/10* (2006.01)
*G11C 17/16* (2006.01)
(Continued)

(52) U.S. Cl.
CPC ............ *G11C 17/16* (2013.01); *G11C 17/18* (2013.01); *G11C 29/76* (2013.01); *G11C 29/785* (2013.01); *G11C 29/789* (2013.01)

(58) Field of Classification Search
CPC .......... G11C 17/18; G11C 17/16; G11C 29/78
(Continued)

(56) References Cited

U.S. PATENT DOCUMENTS 5,430,679 A    7/1995   Hiltebeitel et al.
6,036,101 A    3/2000   Bolan et al.
(Continued)

FOREIGN PATENT DOCUMENTS

TW    I478313 B       3/2015
TW    201542260 A    11/2015
WO    2018052596 A1   3/2018

OTHER PUBLICATIONS

U.S. Appl. No. 15/681,143, entitled "Apparatuses and Methods for Storing Redundancy Repair Information for Memories", filed Aug. 18, 2017.
(Continued)

*Primary Examiner* — Vu Le
(74) *Attorney, Agent, or Firm* — Dorsey & Whitney LLP

(57) ABSTRACT

Apparatuses and methods for transmitting fuse data from fuse arrays to latches are described. An example apparatus includes: a plurality of fuse arrays, each fuse array of the plurality of fuse arrays being configured to store input data; a fuse circuit that receives the input data and provides the input data on a bus; and a plurality of redundancy latch circuits coupled to the bus, including a plurality of pointers and a plurality of latches associated with the plurality of corresponding pointers that load data on the bus. The fuse circuit may control loading of the input data by controlling a location of a pointer among the plurality of corresponding pointers responsive to the input data.

20 Claims, 25 Drawing Sheets

Related U.S. Application Data

No. 15/265,671, filed on Sep. 14, 2016, now Pat. No. 9,666,307.

(51) Int. Cl.
  *G11C 29/00* (2006.01)
  *G11C 17/18* (2006.01)
(58) Field of Classification Search
  USPC .......................... 365/189.05, 200, 230.08, 96
  See application file for complete search history.

(56) References Cited

U.S. PATENT DOCUMENTS

| | | | |
|---|---|---|---|
| 6,211,710 | B1 | 4/2001 | Madhu et al. |
| 6,262,923 | B1 | 7/2001 | Fujita |
| 6,697,289 | B1 | 2/2004 | Yamamoto |
| 7,215,586 | B2 | 5/2007 | Martin et al. |
| 9,666,307 | B1 | 5/2017 | Fujiwara et al. |
| 2002/0141264 | A1 | 10/2002 | Mori et al. |
| 2002/0167855 | A1 | 11/2002 | Hsu et al. |
| 2004/0004510 | A1 | 1/2004 | Lehmann |
| 2004/0019763 | A1 | 1/2004 | Lakhani et al. |
| 2004/0085814 | A1* | 5/2004 | Kawai .................... G11C 16/20 365/185.09 |
| 2004/0190357 | A1 | 9/2004 | Scheuerlein et al. |
| 2005/0046002 | A1 | 3/2005 | Lee et al. |
| 2007/0268760 | A1 | 11/2007 | Iwai |
| 2008/0270828 | A1 | 10/2008 | Wienchol |
| 2008/0284037 | A1 | 11/2008 | Andry et al. |
| 2013/0258748 | A1 | 10/2013 | Kim et al. |
| 2013/0322183 | A1 | 12/2013 | Jeong |
| 2014/0241085 | A1 | 8/2014 | Ryu et al. |
| 2014/0369143 | A1 | 12/2014 | Eichmeyer |
| 2015/0135038 | A1 | 5/2015 | Wilson et al. |
| 2015/0179237 | A1* | 6/2015 | Jeong .................... G11C 7/106 365/154 |

OTHER PUBLICATIONS

U.S. Appl. No. 15/681,183, entitled "Apparatuses and Methods for Latching Redundancy Repair Addresses At a Memory", filed Aug. 18, 2017.
U.S. Appl. No. 15/493,772, entitled: "Apparatuses and Methods for Flexible Fuse Transmission", filed Apr. 21, 2017.
International Search Report and Written Opinion dated Nov. 27, 2017 for PCT Application No. PCT/US2017/046706.
Office Action dated Mar. 9, 2018 received in Taiwanese Application No. 106128867 (English Translation).

* cited by examiner

| Token_Control_Bit[1] | Token_Control_Bit[0] | Defective Address (DA) + Enable Bit [EB] |

| Token_Control_Bits | | Number of latches to be skipped |
|---|---|---|
| [1] | [0] | |
| 0 | 0 | 0 |
| 0 | 1 | 1 |
| 1 | 0 | 2 |
| 1 | 1 | 3 |

FIG. 2B

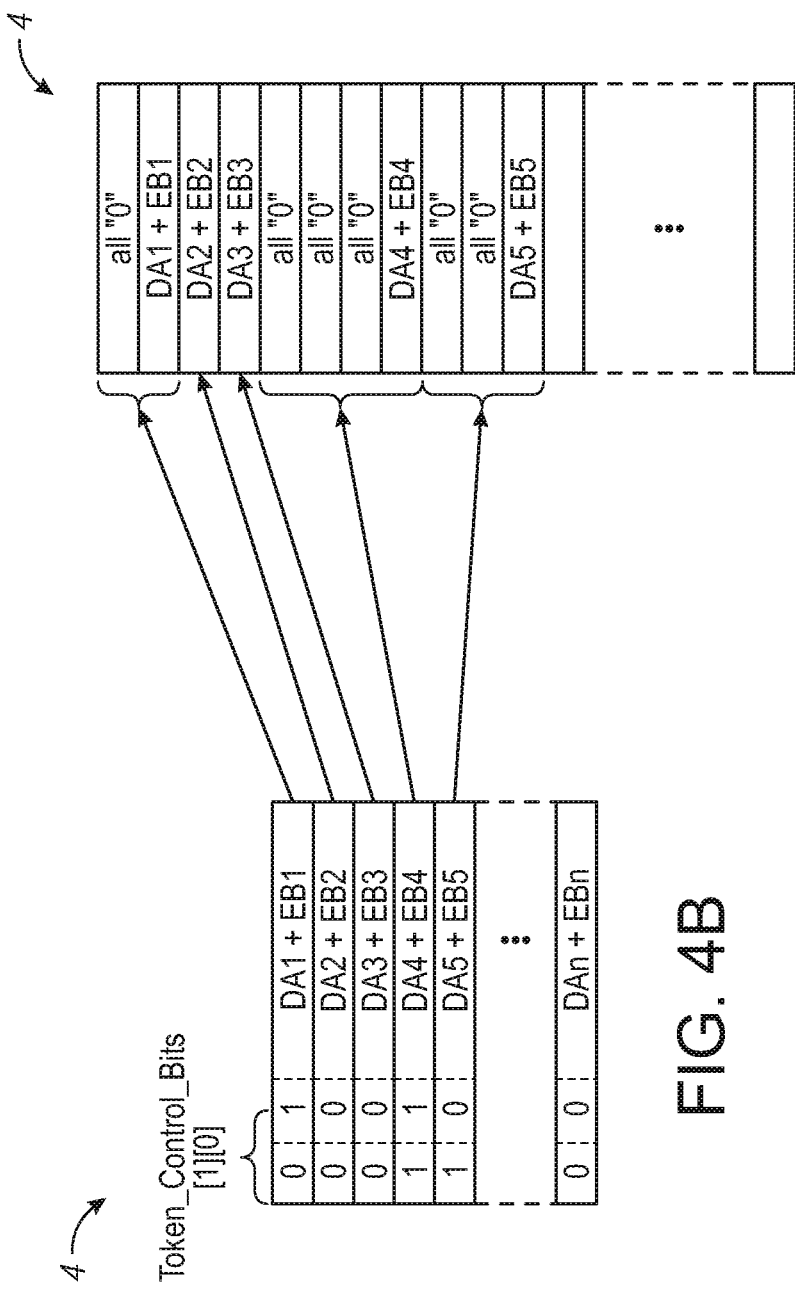

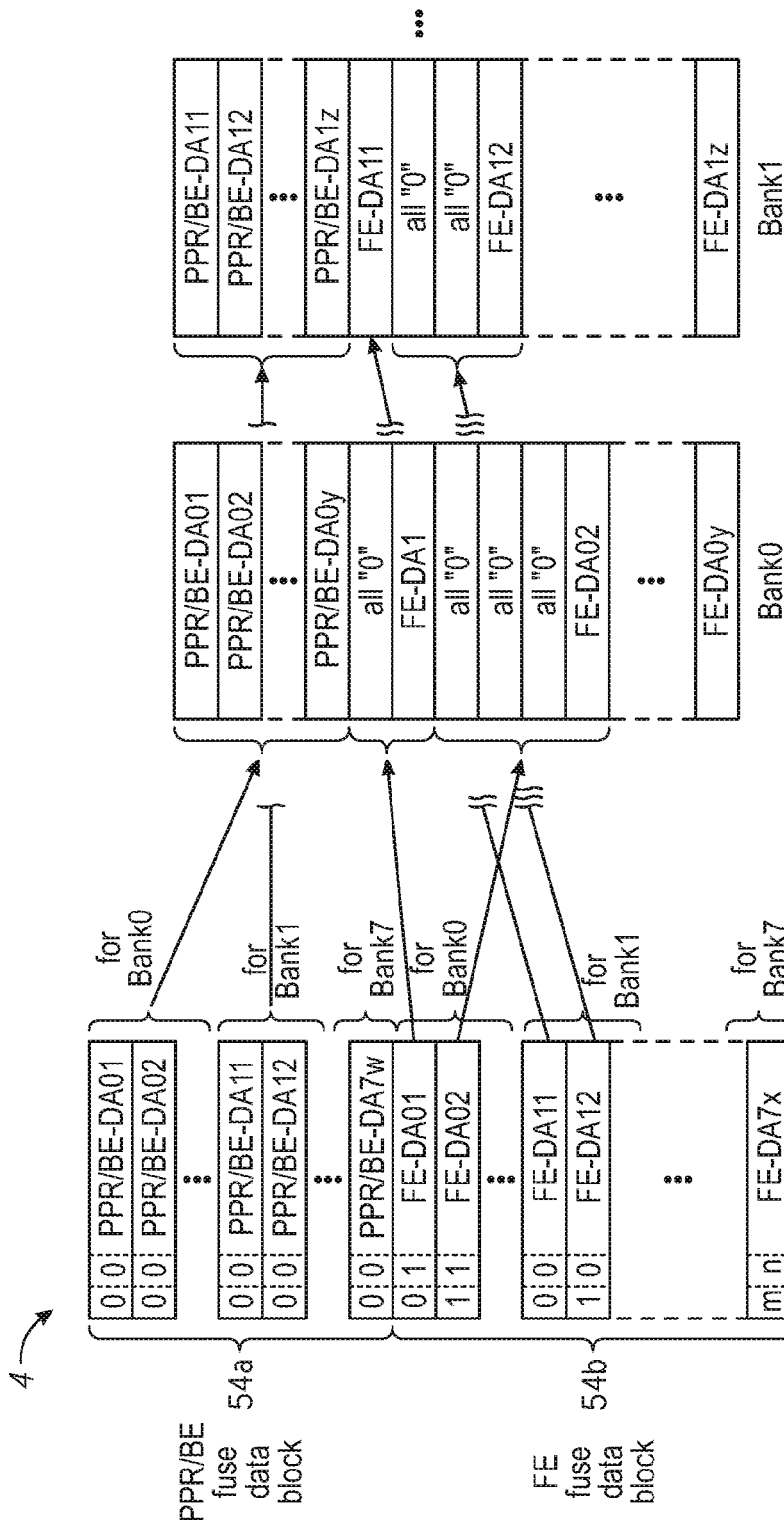

APPARATUSES AND METHODS FOR FLEXIBLE FUSE TRANSMISSION

CROSS-REFERENCE TO RELATED APPLICATION(S)

This application is a continuation of U.S. application Ser. No. 15/493,772 filed Apr. 21, 2017, issued as U.S. Pat. No. 9,824,770 on Nov. 21, 2017, which is a continuation of U.S. application Ser. No. 15/265,671 filed Sep. 14, 2016, issued as U.S. Pat. No. 9,666,307 on May 30, 2017. The aforementioned applications and patents are incorporated herein by reference, in their entirety, for any purpose.

BACKGROUND

High data reliability, high speed of memory access, lower power consumption and reduced chip size are features that are demanded from semiconductor memory. One way of achieving high data reliability is by introducing fuse arrays including a plurality of fuse sets and a plurality of redundancy decoders corresponding to the plurality of fuse sets to provide substitute rows/columns of memory cells for defective rows/columns of cells in a memory array. Each fuse set may store an address of a defective cell (Defective Address). Each redundant address decoder receives row/column address signals and compares the received row/column address signals to the defective addresses stored in the fuses. If the received row/column address signals correspond with a defective address stored in any fuse, access to the received row/column address is disabled and the redundant row/column address may be accessed instead. Defective addresses may be obtained and loaded by a plurality of tests, such as a Front End (FE) test in a manufacturing process and a Post Package Repair (PPR)/Back End (BE) test in a packaging process.

Each redundancy decoder may include a pointer (e.g., a flip-flop circuit) which enables its fuse loading. Flip-flop circuits of the plurality of redundancy decoders are coupled in a series, such as in a daisy chain. A location of the pointer in the daisy chain is shifted by every clock cycle and the address for each fuse set may be transmitted by every clock cycle. In this daisy chain configuration, relationships between pointers and corresponding fuse arrays during fuse loading are fixed based on a data structure of fuse arrays and a pointer structure.

BRIEF DESCRIPTION OF THE DRAWINGS

FIG. 2A is a schematic diagram of data structure of a fuse array in the redundancy data loading/transmitting circuit, in accordance with an embodiment of the present disclosure.

FIG. 2B is a table of data combinations of Token_Control_Bits stored in the fuse array, in accordance with an embodiment of the present disclosure.

FIG. 4B is a schematic diagram of a data structure of the fuse array circuit in the redundancy data loading/transmitting circuit, in accordance with an embodiment of the present disclosure.

FIG. 4C is a schematic diagram of a data sequence of fuse data on the fuse data bus (and thus fuse data latched in respective redundancy latch circuits (RLs)) in the redundancy data loading/transmitting circuit, corresponding to FIG. 4B.

FIG. 5B is a schematic diagram of a data structure of the fuse array circuit in the redundancy data loading/transmitting circuit, in accordance with an embodiment of the present disclosure.

FIG. 5C is a schematic diagram of a data sequence of fuse data on the fuse data bus (and thus fuse data latched in respective redundancy latch circuits (RLs)) in the redundancy data loading/transmitting circuit, corresponding to FIG. 5B.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
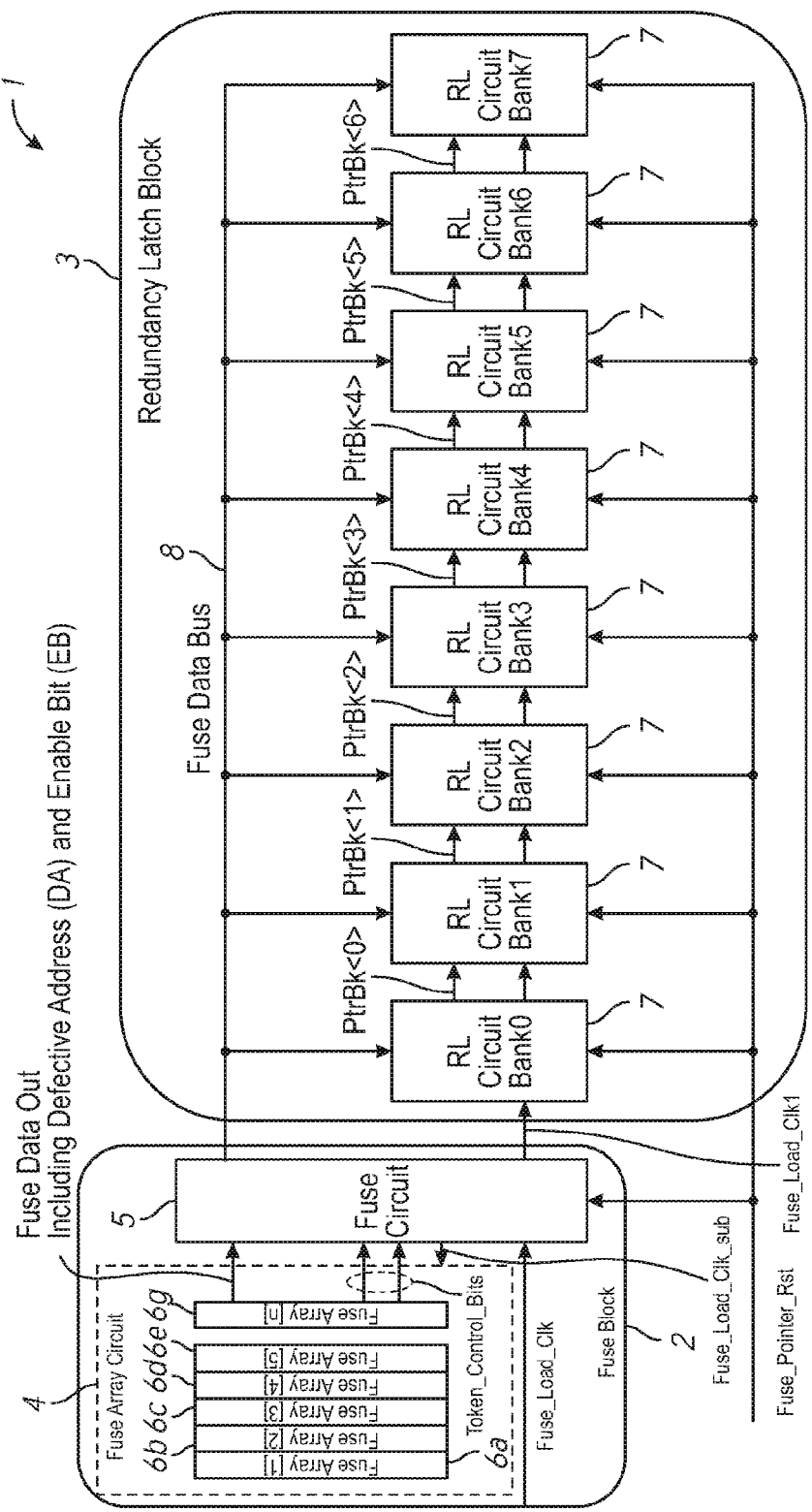
FIG. 1 is a block diagram of a redundancy data loading/transmitting circuit in a semiconductor device, in accordance with an embodiment of the present disclosure.

FIG. 1 is a block diagram of a redundancy data loading/transmitting circuit 1 in a semiconductor device, in accordance with an embodiment of the present disclosure. For example, the redundancy data loading/transmitting circuit 1 may include a fuse block 2 and a redundancy latch block 3. The fuse block 2 may include a fuse array circuit 4 and a fuse circuit 5. The fuse array circuit 4 may include fuse arrays [1:n] 6a to 6g. Each of the fuse arrays 6a to 6g may include a plurality of fuses and may further store a token and a plurality of Token_Control_bits. Each fuse may be any kind of fuses. For example, each fuse may be a laser-fuse, an anti-fuse, and so on. The token may include a defective address (DA) including a row address and/or a column address of a defective cell, and an enable bit (EB) indicative of whether the defective address (DA) is valid or invalid. The plurality of Token_Control_bits may indicate a number of pointers to be skipped to enable or disable loading of fuse data from the plurality of fuses in each of the fuse arrays 6a to 6g. The fuse block 2 may function as a control circuit that includes the fuse circuit 5. The fuse circuit 5 may be disposed between the fuse array circuit 4 and the redundancy latch block 3. The fuse circuit 5 may receive a reference clock signal Fuse_Load_Clk as a reference clock signal. The fuse circuit 5 may further receive a Fuse_Data_Out signal and the plurality of Token_Control_bits. The Fuse_Data_Out signal may include the defective address (DA) and the enable bit (EB). The fuse circuit 5 may process the plurality of Token_Control_bits and may further control loading of the defective address (DA) by controlling a location of an active pointer. For example, controlling the location of the pointer may include shifting the number of pointers to be skipped or shifting to a next pointer for loading the defective address (DA) without skipping. The fuse circuit 5 may provide a reference clock signal Fuse_Load_Clk_sub to the fuse array circuit 4 responsive to the reference clock signal Fuse_Load_Clk and the plurality of Token_Control_bits. The fuse circuit 5 may shift the token for loading the defective address (DA) without skipping by receiving the Fuse Data Out signal and providing the defective address (DA) and the enable bit (EB) responsive to the reference clock signal Fuse_Load_Clk_sub. The fuse circuit 5 may provide a reference clock signal Fuse_Load_Clk1 to the redundancy latch block 3 responsive to the reference clock signal Fuse_Load_Clk. The fuse circuit 5 may further provide a Fuse Data Bus 8 with fuse data signals including valid data, such as the defective address (DA), or invalid data (e.g., all bit indicative of "0" or set to a logic low level) to the redundancy latch block 3. It should be noted that, as the invalid data is accompanied with at least the enable bit (EB) set to represent the invalid status, such as the logic low level, the remaining bits thereof may take either the logic low level or a logic high level. In case where the invalid status is represented by the logic high level, further, all the bits of the invalid data may take the logic high level.

The redundancy latch block 3 may include a plurality of redundancy latch (RL) circuits 7 coupled in series for a plurality of respective banks (e.g., Bank0 to Bank7). The plurality of redundancy latch (RL) circuits 7 coupled to the Fuse Data Bus 8 may latch logic states of the Fuse_Data_Bus signal responsive to the reference clock signal Fuse_Load_Clk1. A bank pointer signal PtrBk<n> (n is an integer) may be transmitted between Bankn and Bank(n+1). For example, the redundancy latch (RL) circuit Bank0 7 may provide a bank pointer signal PtrBk<0> to the redundancy latch (RL) circuit Bank1 7. The bank pointer signal PtrBk<n> may represent a pointer of a latch in the plurality of redundancy latch (RL) circuits 7 that may be activated to latch a logic state of the Fuse_Data_Bus signal. During an initialization of the redundancy data loading/transmitting circuit 1, a reset signal Fuse_Pointer_Rst may be provided to reset the fuse circuit 5 and the plurality of redundancy latch (RL) circuit 7.

FIG. 2A is a schematic diagram of data structure of a fuse array 20 in the redundancy data loading/transmitting circuit 1, in accordance with an embodiment of the present disclosure. For example, the fuse array 20 may be used as the fuse arrays 6a to 6g in FIG. 1. The fuse array 20 may include a plurality of fuses. The fuse array 20 may store Token_Control_Bits [1:0], though a number of bits in the plurality of Token_Control_Bits may not be limited to two. The fuse array 20 may further store fuse data, including a defective address (DA) and an enable bit (EB) for each bank. FIG. 2B is a table of data combinations of the fuse array 20, in accordance with an embodiment of the present disclosure. The Token_Control_Bits [1:0] may be a binary number representing a number of pointers to be skipped to enable or disable loading of fuse data from the plurality of fuses in each fuse array 20. For example, a number of redundancy latch (RL) circuits 7 to be skipped for loading may be zero and loading is enabled (e.g., an enabled state) when the Token_Control_Bits [1:0] are "00". Similarly, the number of redundancy latch (RL) circuits 7 to be skipped for loading may be one, two or three and loading to a latch addressed by the current pointer is disabled (e.g., a disabled state), when the Token_Control_Bits [1:0] are "01", "10" or "11" respectively.

Figure 3:
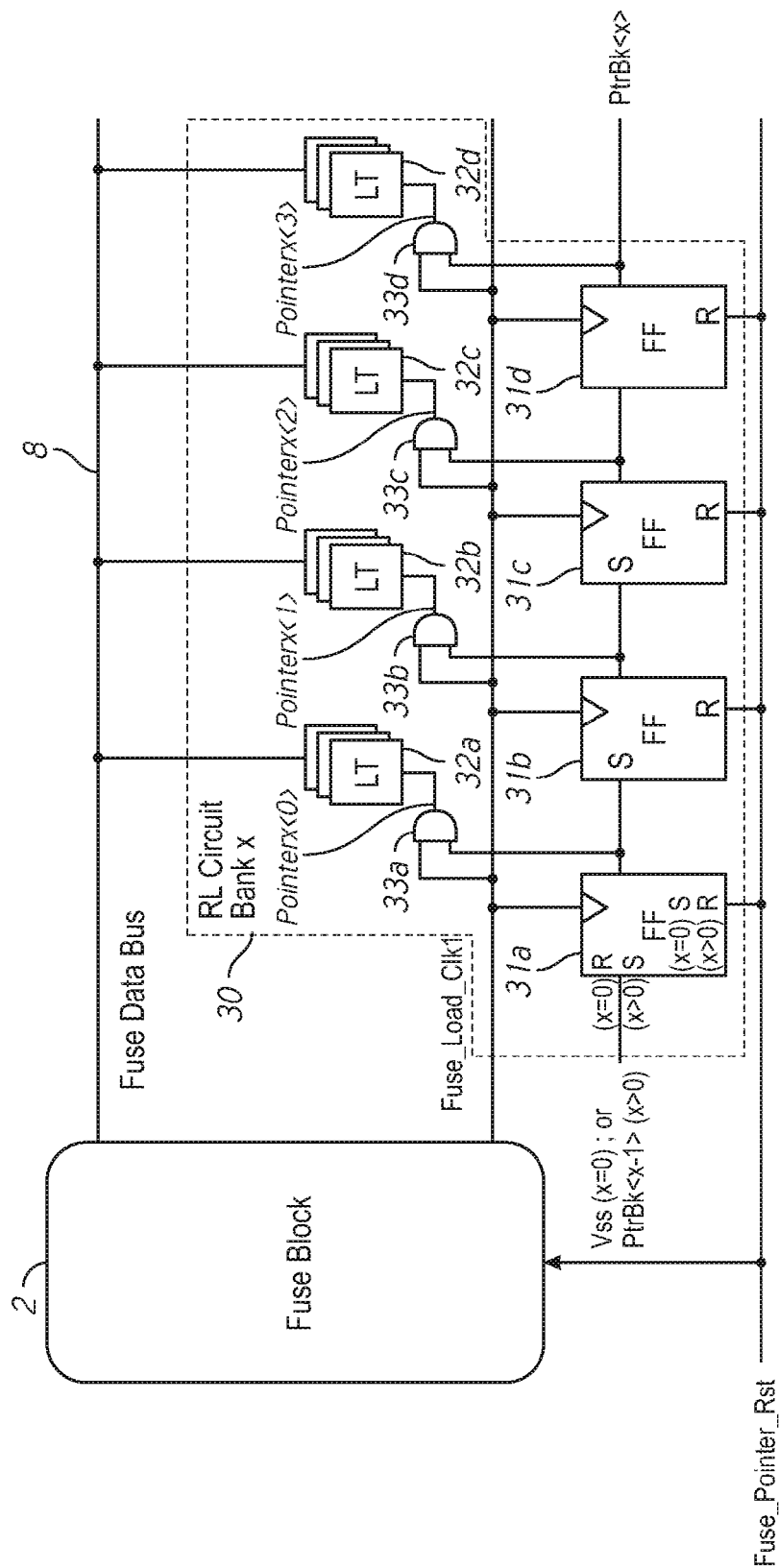
FIG. 3 is a circuit diagram of a redundancy latch (RL) circuit in the redundancy data loading/transmitting circuit, in accordance with an embodiment of the present disclosure.

FIG. 3 is a circuit diagram of a redundancy latch (RL) circuit 30 in the redundancy data loading/transmitting circuit 1, in accordance with an embodiment of the present disclosure. For example, the redundancy latch (RL) circuit 30 in FIG. 3 may be used as the redundancy latch (RL) circuit 7 in FIG. 1. In FIG. 3, "x" is a positive integer (x?0) which identifies Bankx. The redundancy latch (RL) circuit Bankx 30 may include a plurality of flip flop circuits 31a to 31d and a plurality of latches (LTs) 32a to 32d. In FIG. 3, a number of the plurality of flip flop circuits (FFs) 31a to 31d and a number of the plurality of latches 32a to 32d are four, however, the number of the plurality of latches 32a to 32d and the number of the plurality of flip flop circuits (FFs) 31a to 31d are not limited to four. For example, an actual number of the plurality of flip flop circuits (FFs) 31 and an actual number of the plurality of latches (LTs) 32 may be a few hundreds. The plurality of latches 32a to 32d may capture data to be loaded and the plurality of flip flop circuits (FFs) 31a to 31d may function as pointers associated with the latches 32a to 32d respectively, to load the data.

Each of the plurality of flip flop circuits (FFs) 31a to 31d may receive a reference clock signal Fuse_Load_Clk1 from the fuse block 2 at a clock input. For example, if the x is 0, the redundancy latch (RL) circuit Bank0 30 may include the flip flop circuit (FF) 31a that may receive a power supply voltage Vss (e.g., at a ground level) at a reset input and a Fuse_Pointer_Rst signal at a set input. As for each remaining redundancy latch (RL) circuit Bank (x being other than 0), the redundancy latch (RL) circuit Bankx 30 may include the flip flop circuit (FF) 31a that may receive a bank pointer PtrBk<x−1> at a set input and a Fuse_Pointer_Rst signal at a reset input. The flip flop circuits (FFs) 31b to 31d may receive output signals of the flip flop circuits (FFs) 31a to 31c respectively at a set input, and the Fuse_Pointer_Rst signal at a reset input. The flip flop circuit (FF) 31d may provide a bank pointer PtrBk<x> as an output signal to a redundancy latch (RL) circuit Bankx+1 30 (not shown).

A plurality of logic gates 33a to 33d (e.g., an AND circuit) may receive respective output signals of the plurality of flip-flops (FFs) 31a to 31d and the reference clock signal Fuse_Load_Clk1. The plurality of logic gates 33a to 33d may provide output signals Pointerx<0> to Pointerx<3> respectively, responsive to the corresponding output signals of the plurality of flip-flops (FFs) 31a to 31d and further to each predetermined edge (e.g., a rising edge or a falling edge) of the reference clock signal Fuse_Load_Clk1.

The plurality of latches 32a to 32d coupled in series may receive fuse data, including a defective address (DA) and an enable bit (EB) for each bank, on the Fuse Data Bus 8 coupled to the fuse block 2. The plurality of latches 32a to 32d may further capture the fuse data in response to the respective output signals Pointerx<0> to Pointerx<3>. Although not shown, each of the plurality of latches 32a to 32d is provided to an associated one of a plurality of redundant rows and/or redundant columns to select redundant memory cells in each memory bank. Although not shown, each memory bank further includes a plurality of normal rows and columns to select a plurality of normal memory cells. Here, the plurality of normal rows and columns may include one or more defective rows and/or columns that are to be replaced with one or more corresponding redundant rows and/or columns among the plurality of redundant rows and/or columns, respectively. Thus, each of the plurality of latches 32a to 32d is configured to identify a corresponding one of the plurality of redundant rows and/or columns, which is to be used for a defective one of the plurality of normal rows or columns.

Figure 4A:
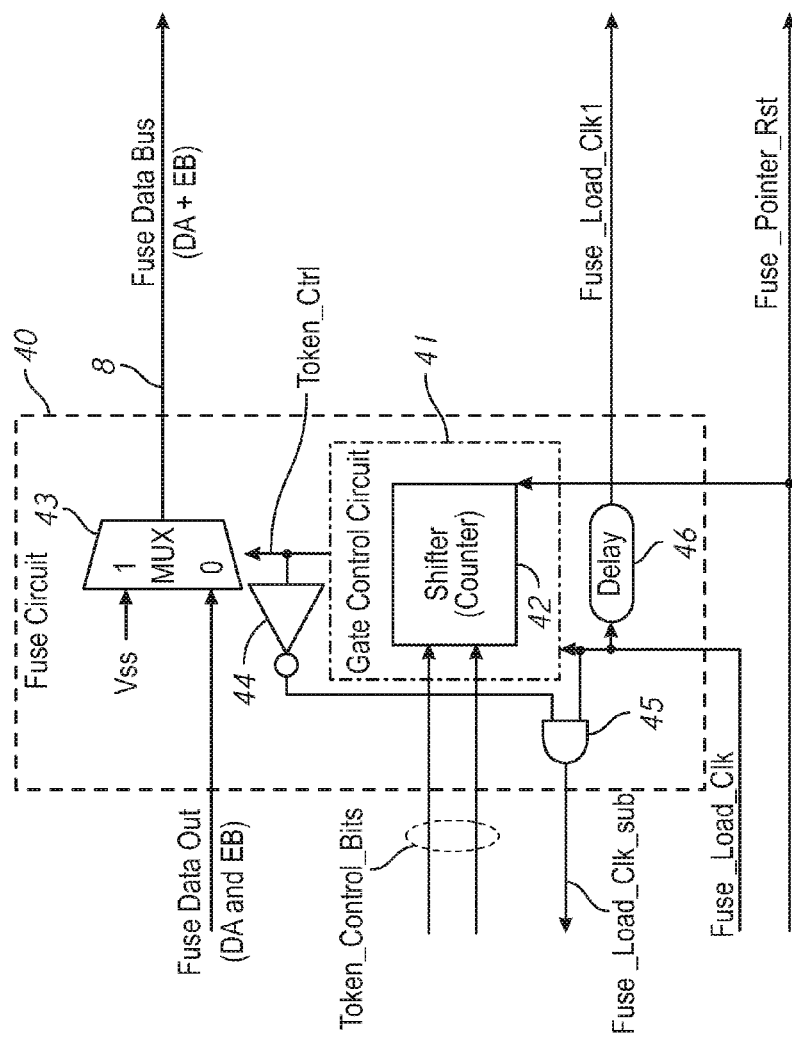
FIG. 4A is a simplified logic circuit diagram of a fuse circuit in the redundancy data loading/transmitting circuit, in accordance with an embodiment of the present disclosure.

FIG. 4A is a simplified logic circuit diagram of a fuse circuit 40 in the redundancy data loading/transmitting circuit 1, in accordance with an embodiment of the present disclosure. For example, the fuse circuit 40 may be used as the fuse circuit 5 in FIG. 1. The fuse circuit 40 may include a gate control circuit 41 including a counter 42. The counter 42 may receive the Token_Control_Bits from the fuse array circuit 4 in FIG. 1 and set the number of latches to be skipped as a count as shown in FIG. 2B. If the count is not "0", the counter 42 may decrement the count at each predetermined edge (e.g., a rising edge or a falling edge) of the reference clock signal Fuse_Load_Clk until the count reaches "0". When the count set to the counter 42 responsive to the Token_Control_Bits is "0", the count is kept constant (e.g., "0").

The gate control circuit 41 may provide a token control signal Token_Ctrl responsive to the count of the counter 42. For example, the token control signal Token_Ctrl may be deactivated (e.g., set to a logic low level, "0") when the count of the counter 42 is "0". The token control signal Token_Ctrl may be activated (e.g., set to a logic high level, "1") when the count of the counter 42 is not "0". The fuse circuit 40 may include an inverter 44 coupled to the gate control circuit 41 and an AND circuit 45. The inverter 44 may receive the token control signal Token_Ctrl from the gate control circuit 41 and may further provide an inverted token control signal. The AND circuit 45 may receive the inverted token control signal and the reference clock signal Fuse_Load_Clk and may further provide a reference clock signal Fuse_Load_Clk_sub to the fuse array circuit 4 when the count value of the counter 42 is "0". Thus, the Fuse Data Out signal may be provided from the fuse array circuit 4 responsive to the reference clock signal Fuse_Load_Clk_sub. The fuse circuit 40 may include a delay circuit 46 that may provide a reference clock signal Fuse_Load_Clk1 that has one clock cycle delay relative to the reference clock signal Fuse_Load_Clk.

The fuse circuit 40 may further include a multiplexer MUX 46. The multiplexer MUX 46 may receive the power supply voltage Vss (i.e., the logic low level, "0") and the Fuse Data Out signal from the fuse array circuit 4. The multiplexer MUX 46 may provide either the power supply voltage Vss or the Fuse Data Out signal responsive to either the active token control signal Token_Ctrl (e.g., the logic high level, "1") or the inactive token control signal Token_Ctrl (e.g., the logic low level, "0"). A reset signal Fuse_Pointer_Rst may be used to initialize the fuse circuit 40, including resetting the counter 42, as well as resetting the RLs 7 in the redundancy latch block 3. For example, the reset signal Fuse_Pointer_Rst may be generated as a one-shot pulse signal prior to receiving the Fuse Data Out signal from the fuse array circuit 4 that is receiving the reference clock signal Fuse_Load_Clk.

FIG. 4B is a schematic diagram of a data structure of the fuse array circuit 4 in the redundancy data loading/transmitting circuit 1, in accordance with an embodiment of the present disclosure. FIG. 4C is a schematic diagram of a data sequence of fuse data on the fuse data bus in the redundancy data loading/transmitting circuit 1, corresponding to FIG.

Figure 4D:
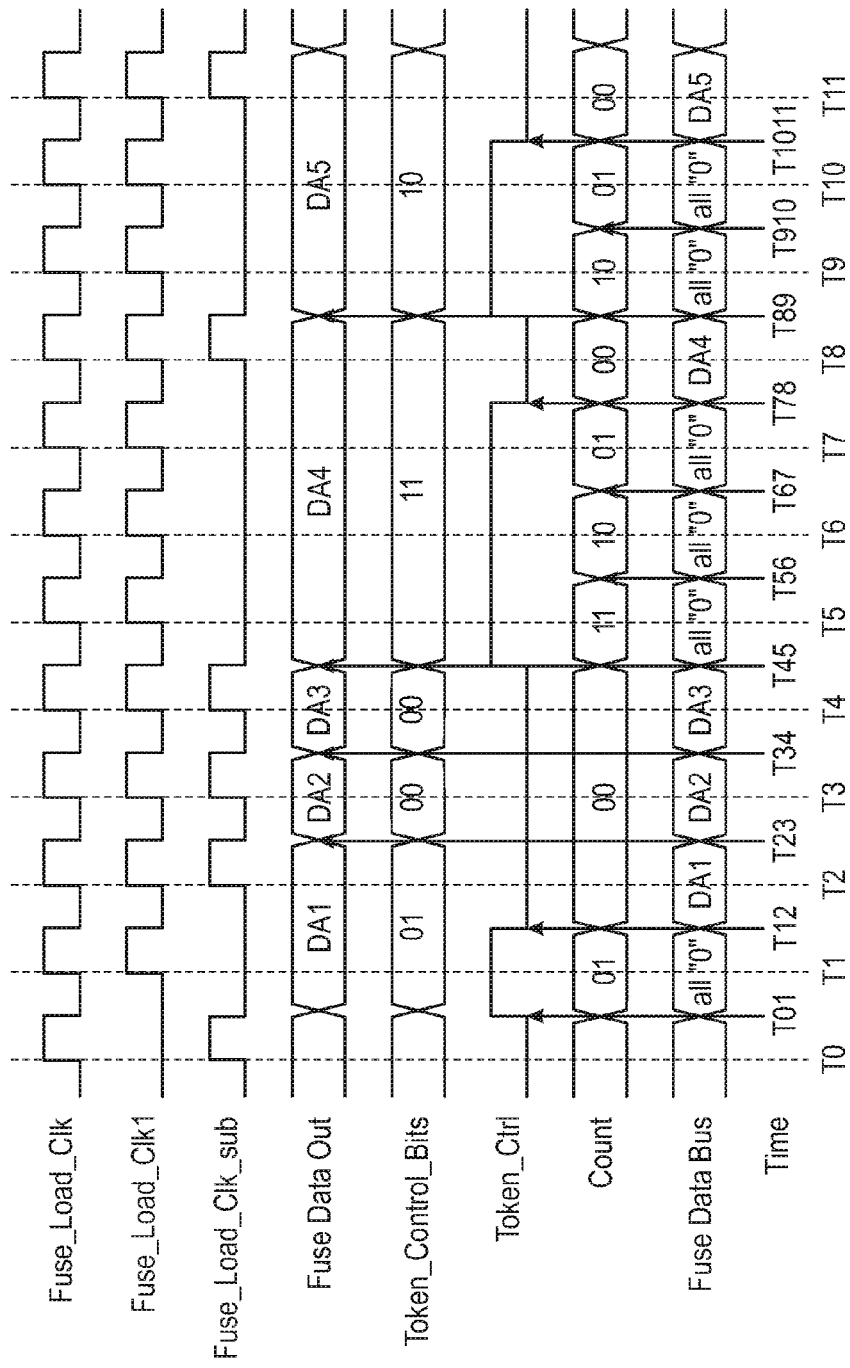
FIG. 4D is a timing diagram of signals in the redundancy data loading/transmitting circuit, corresponding to FIG. 4B.

4B. The fuse data on the fuse data bus may be thus latched in an order of the data sequence into the plurality of latches 32 of the RL circuit Bank0-7 30 as shown in FIG. 3. FIG. 4D is a timing diagram of signals in the redundancy data loading/transmitting circuit 1, corresponding to FIG. 4B.

Upon receipt of the Token Control Bits "01" from the fuse array circuit 4 at T01, a count "01" is set to the counter 42, the gate control circuit 41 may provide the active token control signal Token_Ctrl. Responsive to the active token control signal Token_Ctrl from T01 to T12, the multiplexer MUX 43 may provide an all "0" signal on the Fuse Data Bus 8, regardless of the Fuse_Data_Out signal providing a first defective address DA1. The first defective address DA1 may be provided as the Fuse_Data_Out signal from the fuse array [1] 6a of the fuse array circuit 4 until T23 responsive to the inactive reference clock signal Fuse_Load_Clk_sub from T01 to T12 that is responsive to the active token control signal Token_Ctrl from T01 to T12.

At T12, the counter 42 decrements the count to "00". Responsive to the count "00" at T12, the gate control circuit 41 may provide the inactive token control signal Token_Ctrl. Responsive to the inactive token control signal Token_Ctrl from T12 to T23, the multiplexer MUX 43 may provide the first defective address DA1 of the fuse array [1] 6a on the Fuse Data Bus 8. The first defective address DA1 may be provided as the Fuse_Data_Out signal from the fuse array [1] 6a of the fuse array circuit 4 until T23 responsive to the active reference clock signal Fuse_Load_Clk_sub from T12 to T23 that is responsive to the inactive token control signal Token_Ctrl from T12 to T23. The count "00" is set to the counter 42 responsive to the Token Control Bits representing "00" from the fuse array [2] 6b at T23 and from the fuse array [3] 6c at T34. Responsive to the count "00" at T23 and T34, the gate control circuit 41 may provide the inactive token control signal Token_Ctrl. The fuse array circuit 4 may provide a defective address DA2 of the fuse array [2] 6b at T23 and a defective address DA3 of the fuse array [3] 6c at T34 as the Fuse_Data_Out signal, responsive to the active reference clock signal Fuse_Load_Clk_sub that is responsive to the inactive token control signal Token_Ctrl from T23 to T45. The multiplexer MUX 43 may provide the Fuse_Data_Out signal on the Fuse Data Bus 8 responsive to the inactive token control signal Token_Ctrl from T23 to T45.

Upon receipt of the Token Control Bits "11" from the fuse array [4] 6d at T45, the count "11" is set to the counter 42 and the gate control circuit 41 may provide the active token control signal Token_Ctrl for three clock cycles until T78. Responsive to the active token control signal Token_Ctrl from T45 to T78, the multiplexer MUX 43 may provide an all "0" signal on the Fuse Data Bus 8 until T78, regardless of the Fuse_Data_Out signal providing a defective address DA4 from the fuse array [4] 6d, while the counter 42 decrements the count at T56, T67 and T78. The fuse array circuit 4 may provide the defective address DA4 from the fuse array [4] 6d as the Fuse_Data_Out signal until T89 responsive to the inactive reference clock signal Fuse_Load_Clk_sub from T45 to T78 that is responsive to the active token control signal Token_Ctrl from T45 to T78. At T78, the counter 42 decrements the count to "00". Responsive to the count "00" at T78, the gate control circuit 41 may provide the inactive token control signal Token_Ctrl. Responsive to the inactive token control signal Token_Ctrl from T78 to T89, the multiplexer MUX 43 may provide the defective address DA4 on the Fuse Data Bus 8.

Upon receipt of the Token Control Bits "10" from the fuse array [5] 6e at T89, the count "10" is set to the counter 42 and the gate control circuit 41 may provide the active token control signal Token_Ctrl for two clock cycles until T1011. Responsive to the active token control signal Token_Ctrl from T89 to T1011, the multiplexer MUX 43 may provide an all "0" signal on the Fuse Data Bus 8 until T1011, regardless of the Fuse_Data_Out signal providing a defective address DA5 from the fuse array [5] 6e, while the counter 42 decrements the count at T910 and T1011. The fuse array circuit 4 may provide the defective address DA5 from the fuse array [5] 6e as the Fuse_Data_Out signal responsive to the inactive reference clock signal Fuse_Load_Clk_sub from T89 to T1011 that is responsive to the active token control signal Token_Ctrl from T89 to T1011. At T1011, the counter 42 decrements the count to "00". Responsive to the count "00" at T1011, the gate control circuit 41 may provide the inactive token control signal Token_Ctrl. Responsive to the inactive token control signal Token_Ctrl from T1011, the multiplexer MUX 43 may provide the defective address DA5 on the Fuse Data Bus 8. The respective invalid data (all "0") and valid data (defective addresses DA1 to DA5, each of the defective addresses being accompanied with the enable bit (EB)) are latched in the order of the data sequence in FIG. 4C into the plurality of latches 32 of the RL circuit Bank0-7 30, responsive to each rising edge of the reference clock signal Fuse_Load_Clk1 at respective TI to T11. Thus, some of the plurality of latches 32 may be loaded with the invalid data and the remaining ones thereof are loaded with the valid data including the defective address and the enable bit data.

Figure 5A:
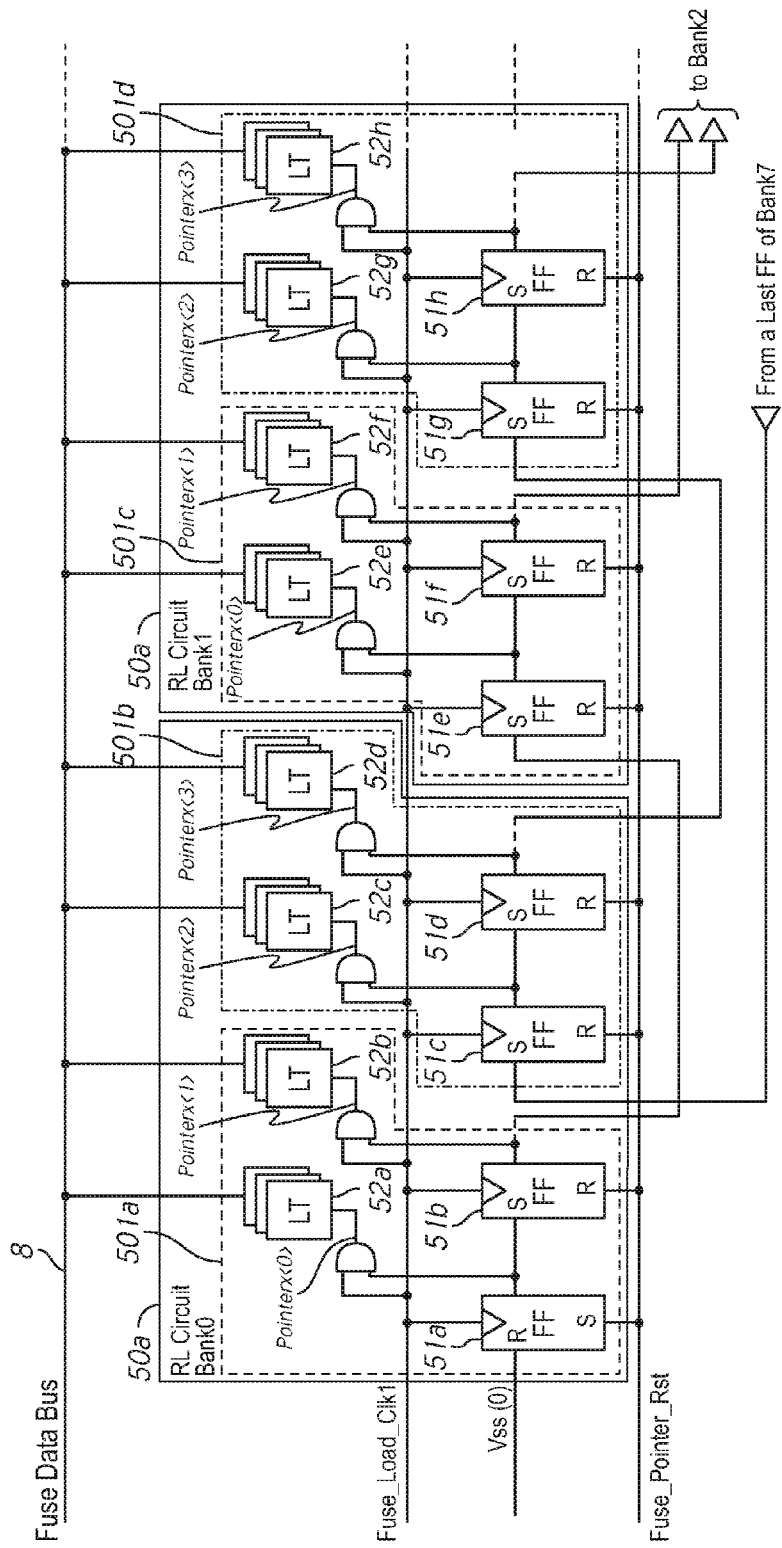
FIG. 5A is a circuit diagram of a plurality of redundancy latch (RL) circuits in the redundancy data loading/transmitting circuit, in accordance with an embodiment of the present disclosure.

FIG. 5A is a circuit diagram of a plurality of redundancy latch (RL) circuits 50a and 50b in the redundancy data loading/transmitting circuit 1, in accordance with an embodiment of the present disclosure. For example, the redundancy latch (RL) circuits 50a and 50b in FIG. 5 may be used as the redundancy latch (RL) circuit 7 in FIG. 1.

The redundancy latch (RL) circuit Bank0 50a may include a plurality of flip flop circuits (FFs) 51a to 51d and a plurality of latches (LT) 52a to 52d. In FIG. 5A, a number of the plurality of flip flop circuits (FFs) 51a to 51d and a number of the plurality of latches 52a to 52d are four, however, the number of the plurality of latches 52a to 52d and the number of the plurality of flip flop circuits (FFs) 51a to 51d are not limited to four. The redundancy latch (RL) circuit Bank0 50a may include a plurality of RL groups 501a and 501b. The RL group 501a may include a plurality of FFs 51a and 51b and a plurality of latches 52a and 52b. The RL group 501b may include a plurality of FFs 51c and 51d and a plurality of latches 52c and 52d.

The redundancy latch (RL) circuit Bank1 50b may include a plurality of flip flop circuits (FFs) 51e to 51h and a plurality of latches (LT) 52e to 52h. In FIG. 5A, a number of the plurality of flip flop circuits (FFs) 51e to 51h and a number of the plurality of latches 52e to 52h are four, however, the number of the plurality of latches 52e to 52h and the number of the plurality of flip flop circuits (FFs) 51e to 51h are not limited to four. The redundancy latch (RL) circuit Bank1 50b may include a plurality of RL groups 501c and 501d. The RL group 501c may include a plurality of FFs 51e and 51f and a plurality of latches 52e and 52f. The RL group 501d may include a plurality of FFs 51g and 51h and a plurality of latches 52g and 52h.

For example, the RL groups 501a and 501c are in a chain and a plurality of latches, including the latches 52a, 52b, 52e and 52f in the chain, may store Post Package Repair (PPR)/Back End (BE) defective address (DA) related to row/column addresses of defective cells detected in tests in a packaging process. The RL groups 501b and 501d are in another chain and a plurality of latches, including the latches 52c, 52d, 52g and 52h, in the other chain may store Front End (FE) defective address (DA) related to row/column addresses of defective cells detected in tests in a semiconductor wafer (e.g., chip/die) manufacturing process.

Each of the plurality of flip flop circuits (FFs) 51a to 51h may receive a reference clock signal Fuse_Load_Clk1 from the fuse block 2 at a clock input. For example, the redundancy latch (RL) circuit Bank0 50a may include the flip flop circuit (FF) 51a that may receive a power supply Vss (e.g., at a ground level) at a reset input and a Fuse_Pointer_Rst signal at a set input. Other than the flip flop circuit 51a, the flip flop circuits 51b to 51h may receive a Fuse_Pointer_Rst signal at a reset input.

The flip flop circuit (FF) 51b in the redundancy latch (RL) circuit Bank0 50a may receive an output signal of the flip flop circuit (FF) 51a at a set input. An output of the flip flop circuit (FF) 51b may be coupled to the flip flop circuit (FF) 51e in the redundancy latch (RL) circuit Bank1 50b. Thus, the flip flop circuit (FF) 51e may receive an output signal of the flip flop circuits (FF) 51b at a set input. The flip flop circuit (FF) 51f may receive an output signal of the flip flop circuit (FF) 51e at a set input. An output of the flip flop circuit (FF) 51f may be coupled to a flip flop circuit (FF) in the chain for PPR/BE data in a redundancy latch (RL) circuit Bank2 (not shown).

The flip flop circuit (FF) 51c in the RL Bank0 50a may receive an output signal of the flip flop circuit (FF) in a redundancy latch (RL) circuit Bank7 (e.g., a last FF of the redundancy latch (RL) circuit Bank7 (not shown)) at a set input. An output of the flip flop circuit (FF) 51c may be coupled to the flip flop circuit (FF) 51d. Thus, the flip flop circuit (FF) 51d may receive an output signal of the flip flop circuit (FF) 51c at a set input. An output of the flip flop circuit (FF) 51d may be coupled to the flip flop circuit (FF) 51g in the redundancy latch (RL) circuit Bank1 50b. Thus, the flip flop circuit (FF) 51g may receive an output signal of the flip flop circuits (FF) 51d at a set input. The flip flop circuit (FF) 51h may receive an output signal of the flip flop circuit (FF) 51g at a set input. An output of the flip flop circuit (FF) 51g may be coupled to a flip flop circuit (FF) in the chain for FE data in the redundancy latch (RL) circuit Bank2.

FIG. 5B is a schematic diagram of a data structure of the fuse array circuit 4 in the redundancy data loading/transmitting circuit 1, in accordance with an embodiment of the present disclosure. FIG. 5C is a schematic diagram of a data sequence of fuse data on the fuse data bus in the redundancy data loading/transmitting circuit 1, corresponding to FIG. 5B. The fuse array circuit 4 may include a PPR/BE fuse data block 54a and a FE fuse data block 54b. The PPR/BE fuse data block 54a may include fuse arrays storing the Token_Control_Bits and PPR/BE defective addresses PPR/BE-DA01 to PPR/BE-DA7w for Bank0 to Bank7, where w is a positive integer and the PPR/BE-DA01 to PPR/BE-DA7w may be transmitted to the chain including the latches 52a, 52b, 52e and 52f. The front end (FE) fuse data block 54b may include fuse arrays storing the Token_Control_Bits and front end defective addresses FE-DA01 to FE-DA-7x for Bank0 to Bank7, where x is a positive integer and the FE-DA01 to FE-DA7x may be transmitted to the chain including the latches 52c, 52d, 52g and 52h. Although not shown, each of the fuse data may further include an enable bit (EB) associated with PPR/BE or FE defective address (DA)

Upon receipt of the Token Control Bits "01" from the fuse array circuit 4, a count "01" may be set to the counter 42, and the multiplexer MUX 43 may provide an all "0" signal on the Fuse Data Bus 8 for one clock cycle as shown in FIG. 5C, before the multiplexer MUX 43 provides first defective address FE-DA01 to the redundancy latch (RL) circuit Bank0 50a. Upon receipt of the Token Control Bits "11" from the fuse array circuit 4, a count "11" may be set to the counter 42, and the multiplexer MUX 43 may provide an all "0" signal on the Fuse Data Bus 8 for three clock cycles as shown in FIG. 5C, before the multiplexer MUX 43 provides second defective address FE-DA02 to the redundancy latch (RL) circuit Bank0 50a. For Bank1, upon receipt of the Token Control Bits "00" from the fuse array circuit 4, a count "00" may be set to the counter 42, and the multiplexer MUX 43 may provide a first defective address FE-DA1 to the redundancy latch (RL) circuit Bank1 50b. Upon receipt of the Token Control Bits "10" from the fuse array circuit 4, a count "10" may be set to the counter 42, and the multiplexer MUX 43 may provide an all "0" signal on the Fuse Data Bus 8 for two clock cycles as shown in FIG. 5C, before the multiplexer MUX 43 provides a second defective addresses FE-DA12 to the redundancy latch (RL) circuit Bank1 50b. Thus, the Post Package Repair (PPR)/Back End (BE) defective addresses (DA) and the Front End (FE) defective addresses (DA) may be stored in the redundancy latch (RL) circuits 50a, 50b, . . . for each bank accordingly.

Figure 6A:
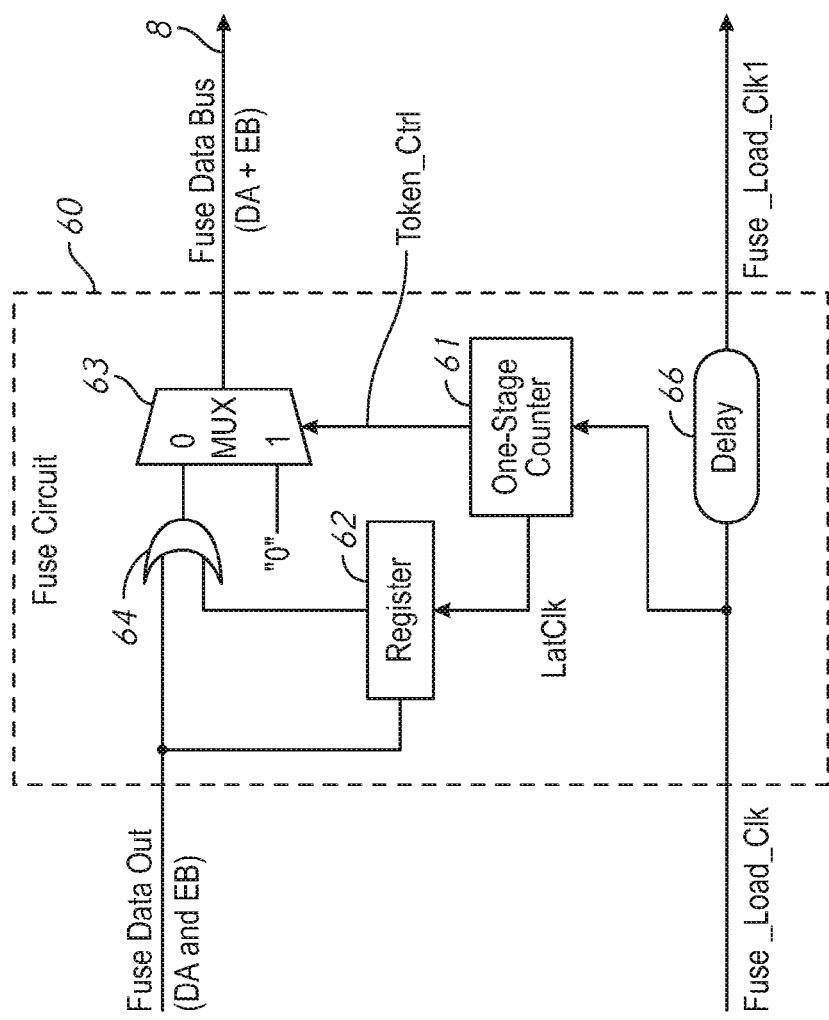
FIG. 6A is a simplified logic circuit diagram of a fuse circuit in the redundancy data loading/transmitting circuit, in accordance with an embodiment of the present disclosure.
Figure 6B:
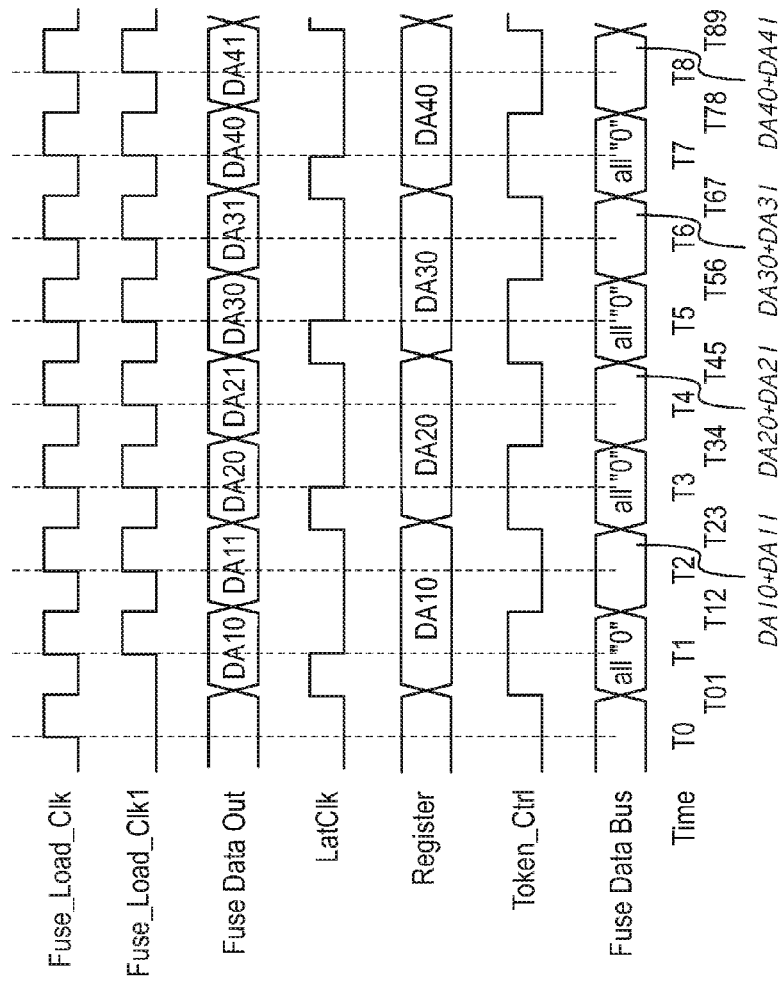
FIG. 6B is a timing diagram of signals in the redundancy data loading/transmitting circuit, corresponding to FIG. 6A.

In some embodiments, defective cell information, such as a defective address, may be stored in two fuse arrays in case of having one fuse array of the two fuse arrays may become defective due to aging. FIG. 6A is a simplified logic circuit diagram of a fuse circuit 60 in the redundancy data loading/transmitting circuit 1, in accordance with an embodiment of the present disclosure. FIG. 6B is a timing diagram of signals in the redundancy data loading/transmitting circuit, corresponding to FIG. 6A. For example, the fuse circuit 60 may be used as the fuse circuit 5 in FIG. 1. The fuse circuit 60 may include a one-stage counter 61. The one-stage counter 61 may receive a reference clock signal Fuse_Load_Clk. The one-stage counter 61 may activate a latching clock signal LatClk and a token control signal Token_Ctrl having a cycle substantially the same as two clock cycles, responsive to a falling edge of the reference clock signal Fuse_Load_Clk at T01, T23, T45, T67, etc. in FIG. 6B. The latching clock signal LatClk may have a pulse width of a half clock cycle. The Token_Ctrl signal may be activated (e.g., having a rising edge) responsive to the falling edge of the reference clock signal Fuse_Load_Clk at T01, T23, T45, T67, etc. in FIG. 6B. The Token_Ctrl signal may further be deactivated (e.g., have a falling edge) responsive to the falling edge of the reference clock signal Fuse_Load_Clk at T12, T34, T56, T78, etc. in FIG. 6B due to the one-stage counter 61. The fuse circuit 60 may include a register 62 that may receive the latching clock signal LatClk from the one-stage counter 61 and the Fuse Data Out signal from the fuse array circuit 4, and may further latch the Fuse Data Out signal with the latching clock signal LatClk. For example, the register 62 may store defective addresses DA10, DA20, DA30, and DA40 in the Fuse Data Out signal at T01, T23, T45 and T67, responsive to the activated LatClk signal. When defective addresses DA10, DA11, DA20, DA21, DA30, DA31, DA40 and DA41 are stored in fuse arrays of the fuse array circuit 4, defective addresses DA11, DA21, DA31 and DA41 are stored as back up defective addresses of DA10, DA20, DA30 and DA40.

The fuse circuit 60 may further include a logic gate circuit 64 that may receive the Fuse Data Out signal and the latched Fuse Data Out signal representing data of the Fuse Data Out signal at one prior clock cycle from the register 62 at T12, T34, T56 and T78. The logic gate circuit 64 may be an OR circuit that computes a logical sum of the received signals or a NAND circuit that computes an inverted logical product of inverted signals of the received signals. Depending on definitions of fuse data for each logic level, the logic gate circuit 64 may be either an NOR circuit that computes an inverted logical sum of the received signals or a AND circuit that computes a logical product of inverted signals of the received signals. The fuse circuit 60 may further include a multiplexer MUX 63. The multiplexer MUX 63 may receive a negative power potential Vss and an output signal of the logic gate circuit 64. The multiplexer MUX 63 may provide either the power potential Vss or the output signal of the logic gate circuit 64 responsive to either the active token control signal Token_Ctrl (e.g., the logic high level, "1") or the inactive token control signal Token_Ctrl (e.g., the logic low level, "0"). For example, the multiplexer MUX 63 may provide all "0" data on the fuse data bus 8 at T01, T23, T45, T67, etc. The multiplexer MUX 63 may provide a result of OR operation of defective addresses DA10 and DA11 at T12, a result of OR operation of defective addresses DA20 and DA21 at T34, a result of OR operation of defective addresses DA30 and DA31 at T56, and a result of OR operation of defective addresses DA40 and DA41 at T78. Thus, proper fuse data may be retrieved and provided on the fuse data bus 8 by storing fuse data in two fuse arrays and computing OR of defective addresses stored in a plurality of fuse arrays (e.g., two fuse arrays), when fuse data including a defective address in one fuse array is deteriorated.

Figure 7A:
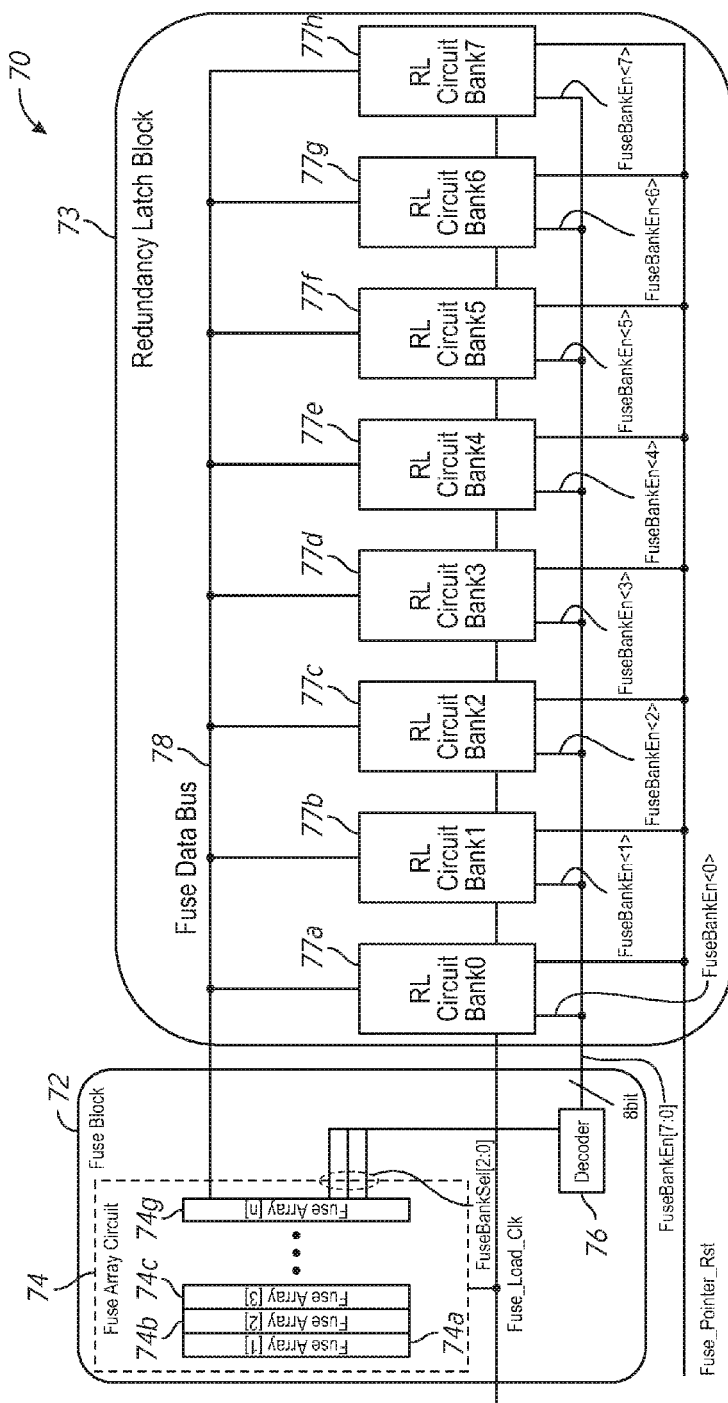
FIG. 7A is a block diagram of a redundancy data loading/transmitting circuit in a semiconductor device, in accordance with an embodiment of the present disclosure.

FIG. 7A is a block diagram of a redundancy data loading/transmitting circuit 70 in a semiconductor device, in accordance with an embodiment of the present disclosure. For example, the redundancy data loading/transmitting circuit 70 may include a fuse block 72 and a redundancy latch block 73. The fuse block 72 may include a decoder circuit 76 and a fuse array circuit 744 including a plurality of fuse arrays [0:n] 74a to 74g. Each of the fuse arrays 74a to 74g may include a plurality of fuses and may further store a token and a plurality of bank selection bits FuseBankSel [2:0] indicative of a bank ID the token is associated. Thus, the token may be stored in any redundancy latch associated with the bank ID. Each fuse may be any kind of fuses. For example, each fuse may be a laser-fuse, an anti-fuse, etc.

Figures 7B, 7C:
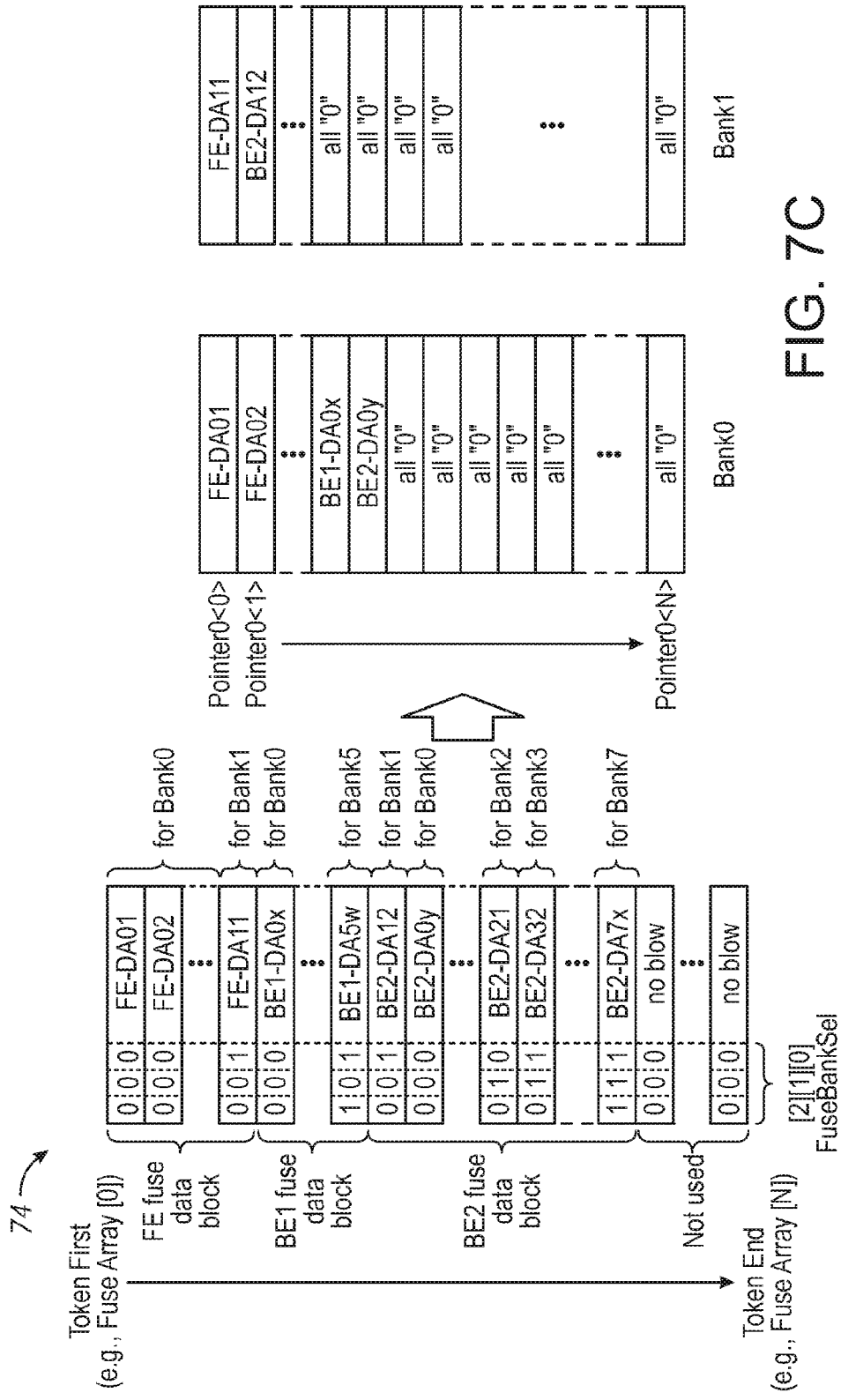
FIG. 7B is a schematic diagram of a data structure of the fuse array circuit in the redundancy data loading/transmitting circuit, in accordance with an embodiment of the present disclosure.
FIG. 7C is a schematic diagram of a data sequence of fuse data on the fuse data bus (and thus fuse data latched in respective redundancy latch circuits (RLs)) in the redundancy data loading/transmitting circuit, corresponding to FIG. 7B.

FIG. 7B is a schematic diagram of a data structure of the fuse array circuit 74 in the redundancy data loading/transmitting circuit 70, in accordance with an embodiment of the present disclosure. FIG. 7C is a schematic diagram of a data sequence of fuse data on the fuse data bus 78 in the redundancy data loading/transmitting circuit 70, corresponding to FIG. 7B. The token may include a defective address (DA) including a row address and a column address of a defective cell. For example, the defective address (DA) may be a defective address FE-DAxy (x represents the bank ID represented by the plurality of bank selection bits FuseBankSel [2:0], y represents an order in Bankx) detected by a test in a manufacturing (front end [FE]) process. The defective address (DA) may be a defective address BEn-DAxy detected by a test in a packaging process (Post Package Repair [PPR]/Back End [BE]), where n is a BE test ID associated with a test in the packaging process in which the defective address is detected. For example, the y-th defective address in Bankx in a first test in the packaging process may be identified as BE1-DAxy. The y-th defective address in Bankx in a second test in the packaging process may be identified as BE2-DAxy.

A decoder circuit 76 may convert the plurality of bank selection bits FuseBankSel [2:0] into a plurality of bank enable bits FuseBankEn [7:0]. Each bit of FuseBankEn<0> to FuseBankEn<7> may be activated responsive to the plurality of bank selection bits FuseBankSel [2:0]. For example, FuseBankEn<1> may be activated responsive to "001" in the plurality of bank selection bits FuseBankSel [2:0]. FuseBankEn<2> may be activated responsive to "010" in the plurality of bank selection bits FuseBankSel [2:0]. FuseBankEn<3> may be activated responsive to "011" in the plurality of bank selection bits FuseBankSel [2:0]. FuseBankEn<0> may be activated responsive to "000" in the plurality of bank selection bits FuseBankSel [2:0]. FuseBankEn<7> may be activated responsive to "111" in the plurality of bank selection bits FuseBankSel [2:0].

The fuse block 72 may provide a reference clock signal Fuse_Load_Clk to the redundancy latch block 73. The fuse block 72 may further provide fuse data signals including valid data such as the defective address (DA) or invalid data (e.g., all bit indicative of "0" or set to a logic low level) to the redundancy latch block 73 via a data bus Fuse Data Bus 78. The redundancy latch block 73 may include a plurality of redundancy latch (RL) circuits 77a to 77h coupled in series for a plurality of respective banks (e.g., Bank0 to Bank7). The plurality of redundancy latch (RL) circuits 77a to 77h coupled to the Fuse Data Bus 78 may latch logic states of the Fuse_Data_Bus signal responsive to the reference clock signal Fuse_Load_Clk and further responsive to a respective bit of the plurality of bank enable bits FuseBankEn [0:7]. For example, the redundancy latch (RL) circuit Bank0 77a may latch the Fuse_Data_Bus signal responsive to the FuseBankEn<0>. For example, the redundancy latch (RL) circuit Bank5 77f may latch the Fuse_Data_Bus signal responsive to the FuseBankEn<5>. During an initialization of the redundancy data loading/transmitting circuit 70, a reset signal Fuse_Pointer_Rst may be provided to the plurality of redundancy latch (RL) circuits 77a to 77h.

Figure 7D:
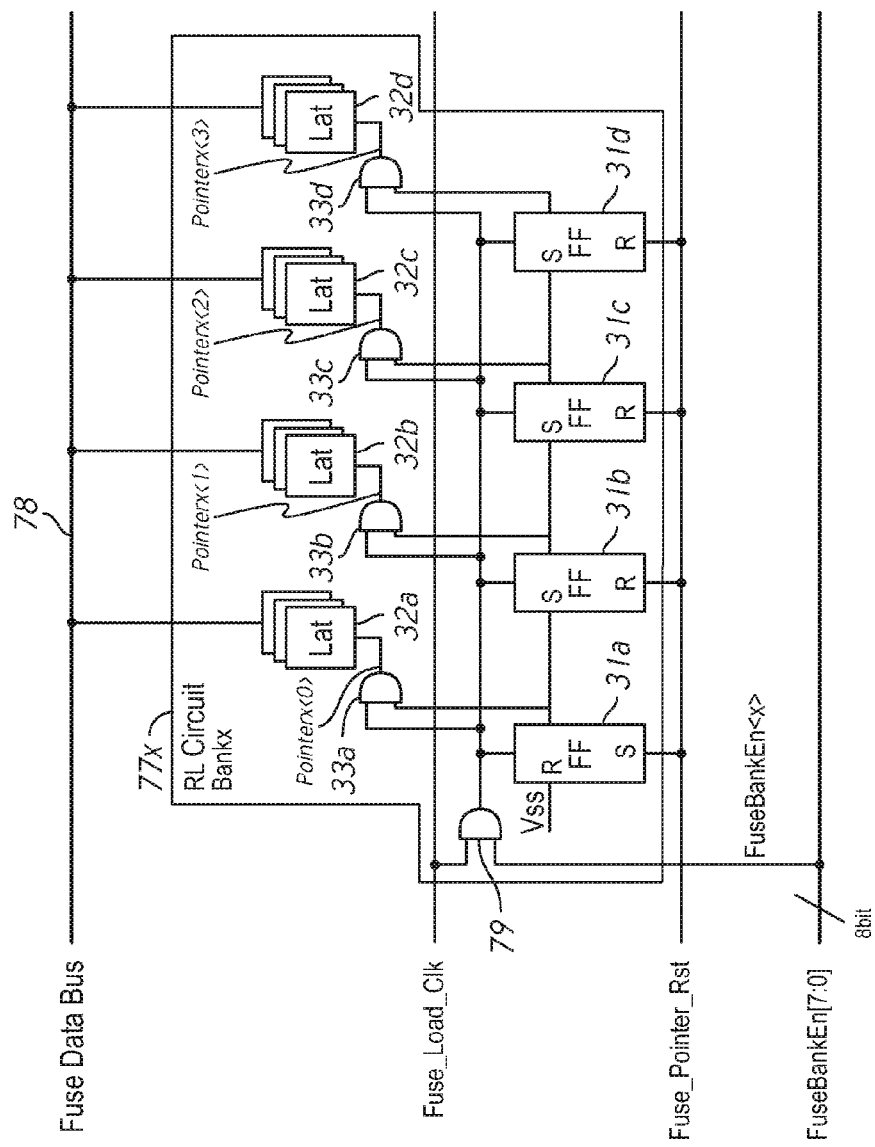
FIG. 7D is a circuit diagram of a redundancy latch (RL) circuit Bankx of redundancy latch circuits (RLs) in the redundancy data loading/transmitting circuit, in accordance with an embodiment of the present disclosure.

FIG. 7D is a circuit diagram of a redundancy latch (RL) circuit Bankx 77x of redundancy latch (RL) circuits 77a to 77h in the redundancy data loading/transmitting circuit 70, in accordance with an embodiment of the present disclosure. The redundancy latch (RL) Bankx 77x is similar to the redundancy latch (RL) circuit Bankx 30 of FIG. 3. Description of components in FIG. 7D corresponding to components included in FIG. 3 previously described will not be repeated. However, in contrast to the redundancy latch (RL) circuit Bankx 30 of FIG. 3, the redundancy latch (RL) circuit 77x may further include a logic gate 79 that receives a corresponding bank enable bit FuseBankEn<x>. Thus, the reference clock signal Fuse_Load_Clk may be provided to the FFs 31a to 31d when Bankx is addressed for latching data on the Fuse Data Bus 78. In this manner, the defective addresses of any bank stored in fuse arrays in a different order, or in different tests in the packaging process, may be stored in redundancy latches associated with the corresponding bank IDs indicated by the plurality of bank selection bits FuseBankSel [2:0] stored in the fuse arrays.

Figure 7E:
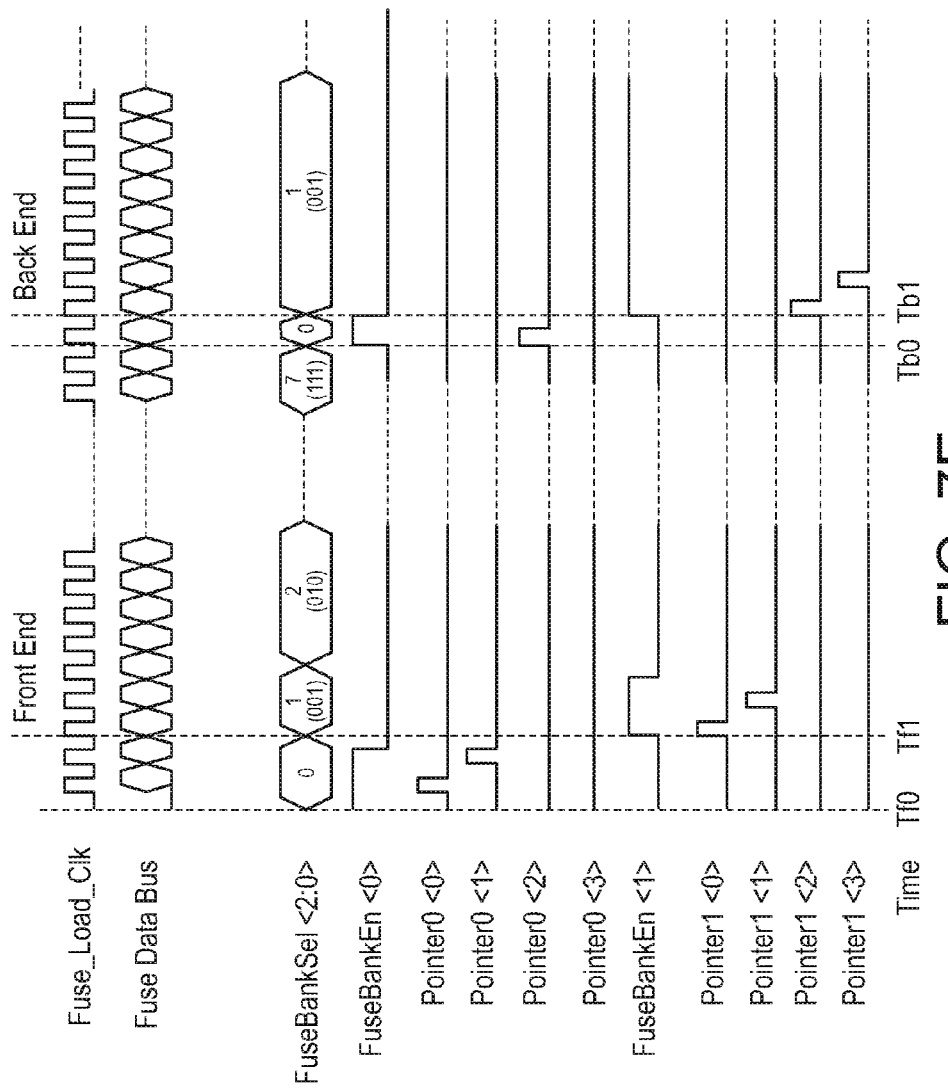
FIG. 7E is a timing diagram of signals in the redundancy data loading/transmitting circuit, corresponding to FIGS. 7A to 7D.

FIG. 7E is a timing diagram of signals in the redundancy data loading/transmitting circuit 70, corresponding to FIGS. 7A to 7D. While loading defective addresses detected by the test in the manufacturing (front end [FE]) process, a bank enable bit FuseBankEn<0> may be activated, and Pointer0<0> signal and Pointer0<1> signal are activated in this order, responsive to "0" of FuseBankSel [2:0] at time Tf0, followed by an active bank enable bit FuseBankEn<1> that activates Pointer1<0> signal and Pointer1<1>, responsive to "001" of FuseBankSel [2:0] at time Tf1. After loading the defective addresses detected by the test in the manufacturing (front end [FE]) process, defective addresses detected by the test in the packaging (back end [BE]) process may be loaded. A bank enable bit FuseBankEn<0> may be activated, and Pointer0<2> signal and Pointer0<3> signal are activated in this order, responsive to "0" of FuseBankSel [2:0] at time Tb0, followed by an active bank enable bit FuseBankEn<1> that activates Pointer1<2> signal and Pointer1<3>, responsive to "001" of FuseBankSel [2:0] at time Tb1. Thus, defective addresses detected in different tests for each bank may be loaded to corresponding redundancy latches for each bank.

Figure 8A:
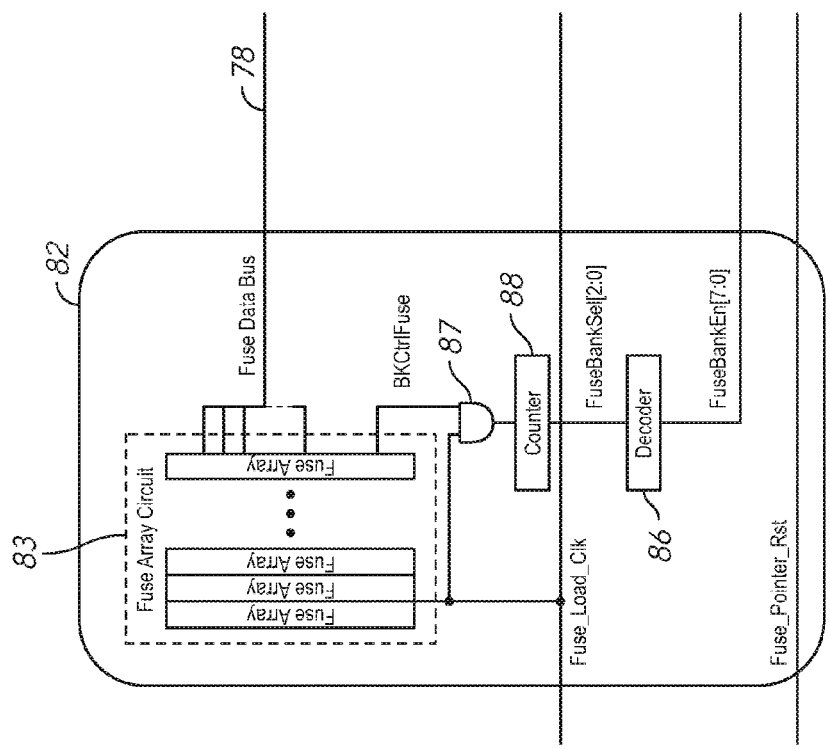
FIG. 8A is a simplified logic circuit diagram of a fuse circuit in the redundancy data loading/transmitting circuit, in accordance with an embodiment of the present disclosure.
Figures 8B, 8C:
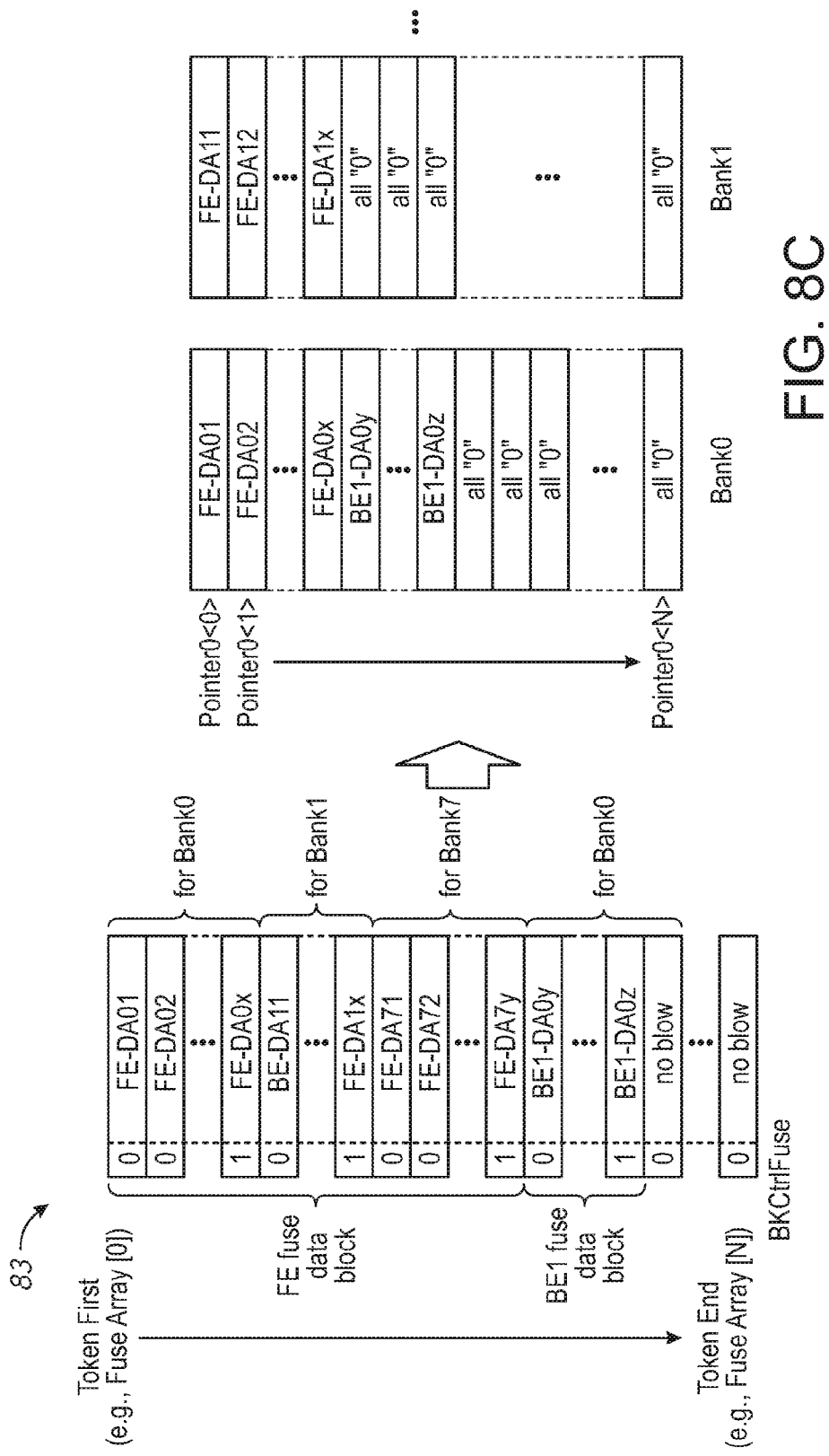
FIG. 8B is a schematic diagram of a data structure of the fuse array circuit in the redundancy data loading/transmitting circuit, in accordance with an embodiment of the present disclosure.
FIG. 8C is a schematic diagram of a data sequence of fuse data on the fuse data bus (and thus fuse data latched in respective redundancy latch circuits (RLs)) in the redundancy data loading/transmitting circuit, corresponding to FIG. 8B.

Bank selection may be executed by a counter instead of including a plurality of bank selection bits FuseBankSel [2:0] representing a bank ID. FIG. 8A is a simplified logic circuit diagram of a fuse block 82 in the redundancy data loading/transmitting circuit 70, in accordance with an embodiment of the present disclosure. The fuse block 82 may be used in place of the fuse block 72 in the redundancy data loading/transmitting circuit 70. Responsive to a reset signal (not shown), a counter 88 may set a count to 0. FIG. 8B is a schematic diagram of a data structure of a fuse array circuit 83 in the redundancy data loading/transmitting circuit 70, in accordance with an embodiment of the present disclosure. FIG. 8C is a schematic diagram of a data sequence of fuse data on the fuse data bus 78 (and thus fuse data latched in respective redundancy latch circuits (RLs)) in the redundancy data loading/transmitting circuit, corresponding to FIG. 8B. Each fuse array in the fuse array circuit 83 may store a defective address and the bank control fuse bit BKCtrlFuse that indicates a relationship between a bank associated with a defective address of a current fuse array and a bank associated with a defective address of a next fuse array. When the bank control fuse bit BKCtrlFuse is active (e.g., "1"), a next fuse array may include a defective address for a next bank. For example, a bank identification number associated with a defective address of the next fuse array is obtained by incrementing a bank identification number associated with a defective address of the current fuse array. For example, the current fuse array includes a defective address of Bank0 and the bank control fuse bit BKCtrlFuse that is not active (e.g., "0"), the next fuse array may include another defective address of Bank0. In contrast, if the current fuse array includes a defective address of Bank0 and the active bank control fuse bit BKCtrlFuse (e.g., "1"), the next fuse array includes a defective address of Bank 1.

A logic gate 87 in the fuse block 82 may receive a bank control fuse bit BKCtrlFuse from each fuse array in the fuse array circuit 83. If the bank control fuse bit BKCtrlFuse is active (e.g., "1") the logic gate 87 may provide an active output signal responsive to an active period of a reference clock signal Fuse_Load_Clk. If at least one of the bank control fuse bit BKCtrlFuse and the reference clock signal Fuse_Load_Clk is not active, the logic gate 87 may deactivate the output signal. The counter 88 may increment the count responsive to the active output signal of the logic gate 87. The count is indicative of a bank to be enabled, and the count is provided as the plurality of bank selection bits FuseBankSel [2:0]. A decoder circuit 86 may convert the plurality of bank selection bits FuseBankSel [2:0] into a plurality of bank enable bits FuseBankEn [7:0].

Figure 8D:
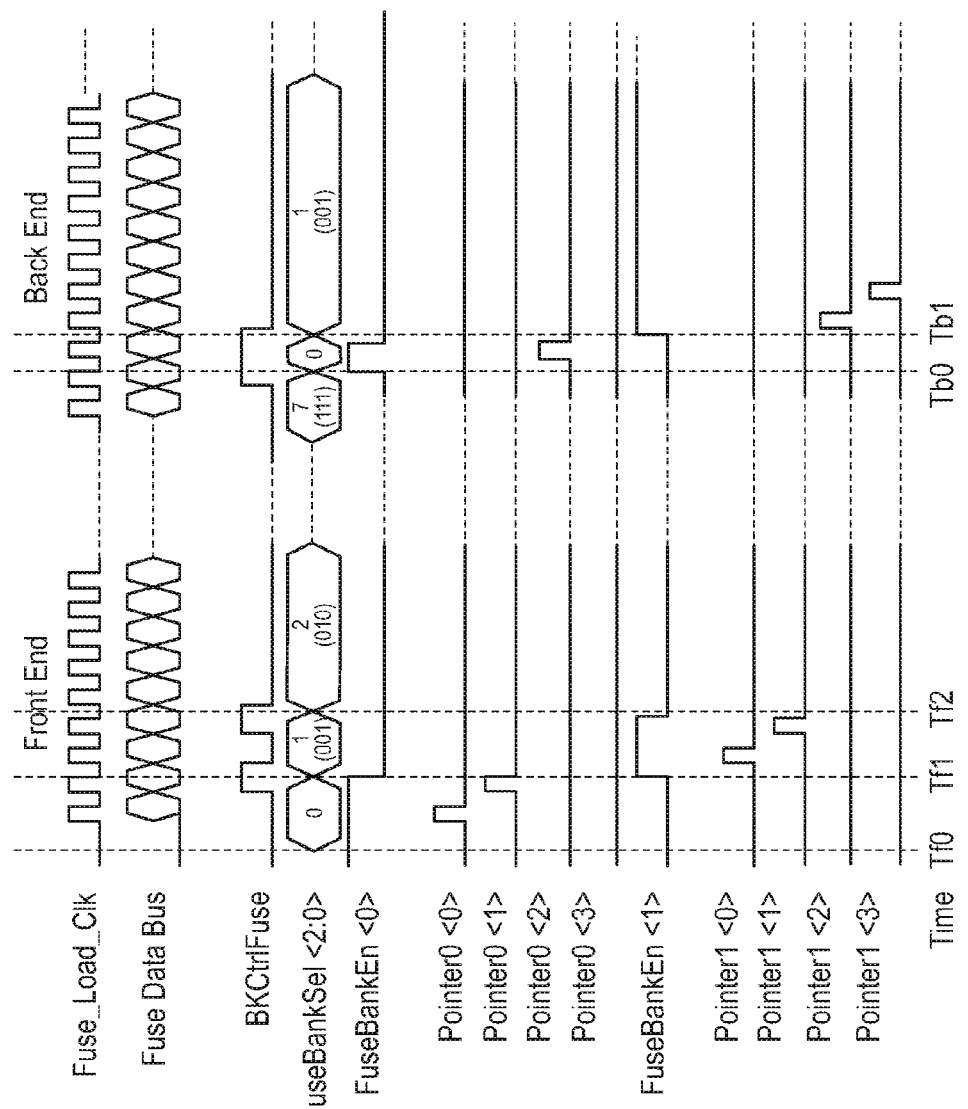
FIG. 8D is a timing diagram of signals in the redundancy data loading/transmitting circuit, corresponding to FIGS. 8A to 8C.

FIG. 8D is a timing diagram of signals in the redundancy data loading/transmitting circuit 70, corresponding to FIGS. 8A to 8C. While loading defective addresses detected by the test in the manufacturing (front end [FE]) process, a bank enable bit FuseBankEn<0> may be activated, and Pointer0<O> signal and Pointer0<1> signal are activated in this order, responsive to "0" of FuseBankSel [2:0] at time Tf0. While loading a last defective address for Bank0 in the test in the manufacturing process, the bank control fuse bit BKCtrlFuse may be set to "1". Responsive to the active bank control fuse bit BKCtrlFuse, the counter may provide "001" of FuseBankSel [2:0] at time Tf1, and the decoder circuit 86 may provide an active bank enable bit FuseBankEn<1> that activates Pointer1<0> signal and Pointer1<1>, responsive to "001" of FuseBankSel [2:0] at time Tf1. After loading the defective addresses detected by the test in the manufacturing (front end [FE]) process, defective addresses detected by the test in the packaging (back end [BE]) process may be loaded. A bank enable bit FuseBankEn<0> may be activated, and Pointer0<2> signal may be activated, responsive to "0" of FuseBankSel [2:0] at time Tb0, followed by a continuously active bank control fuse bit BKCtrlFuse. An active bank enable bit FuseBankEn<1> may be provided to activate Pointer1<2> signal and Pointer1<3>, responsive to "001" of FuseBankSel [2:0] that is responsive to the continuously active bank control fuse bit BKCtrlFuse at time Tb1. Thus, defective addresses detected in different tests for each bank may be loaded to corresponding redundancy latches for each bank.

Figure 9A:
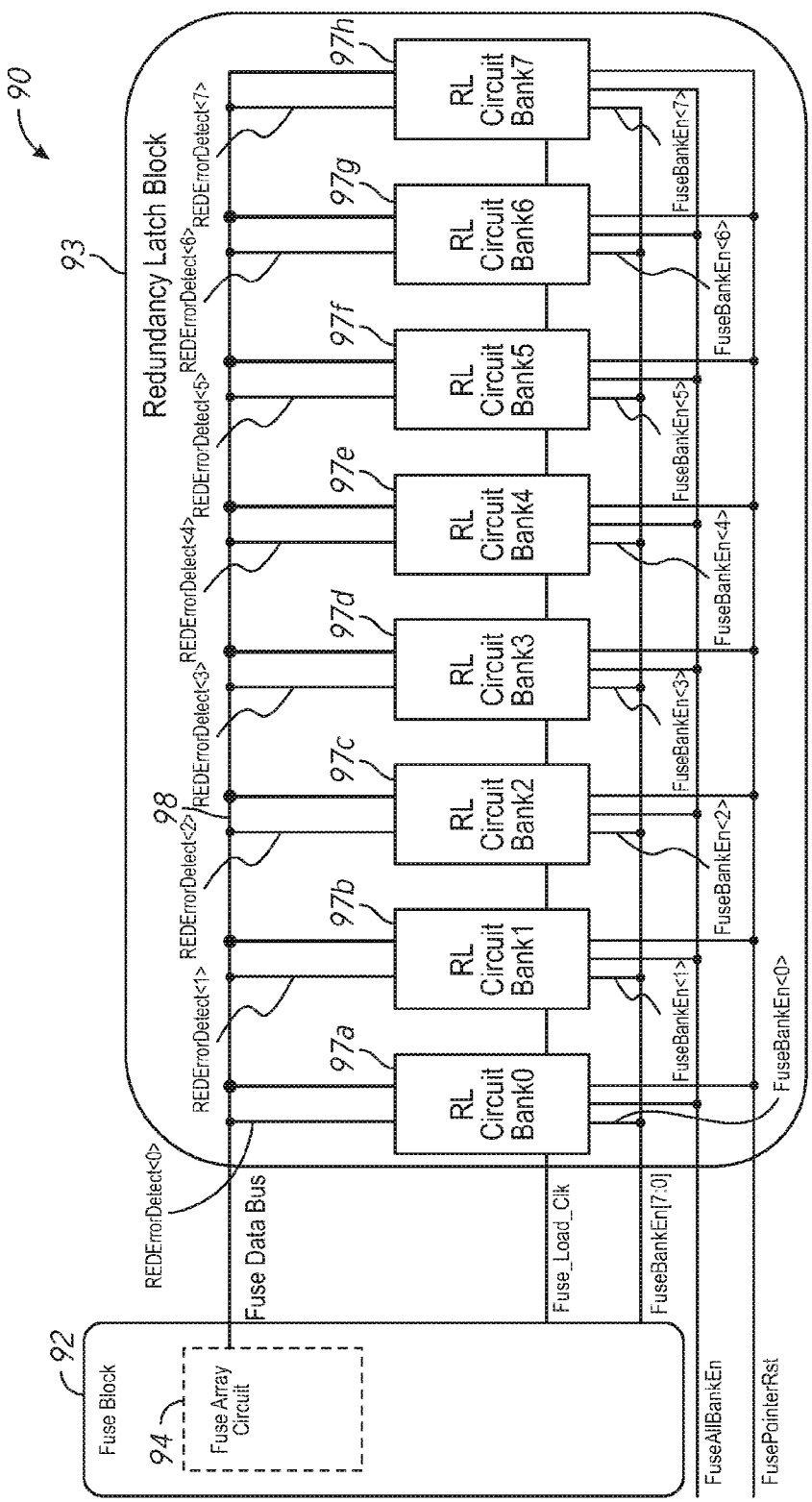
FIG. 9A is a block diagram of a redundancy data loading/transmitting circuit in a semiconductor device, in accordance with an embodiment of the present disclosure.

Redundant error detection information (REDErrorDetect) may be provided when a redundancy latch may be defective. FIG. 9A is a block diagram of a redundancy data loading/transmitting circuit 90 in a semiconductor device, in accordance with an embodiment of the present disclosure. Description of components in FIG. 9A corresponding to components included in FIG. 7A previously described will not be repeated. For example, the redundancy data loading/transmitting circuit 90 may include a fuse block 92 and a redundancy latch block 93. The fuse block 92 may include a fuse array circuit 94. The redundancy latch block 93 may include redundancy latch (RL) circuits 97a to 97h. The redundancy latch (RL) circuits 97a to 97h may further receive an all bank fuse enable signal FuseAllBankEn and a corresponding redundancy error detection signal REDErrorDetect<0> to <7>, in addition to data from a data fuse bus 98, a reference clock signal Fuse_Load_Clk and a reset signal Fuse_Pointer_Rst.

Figure 9B:
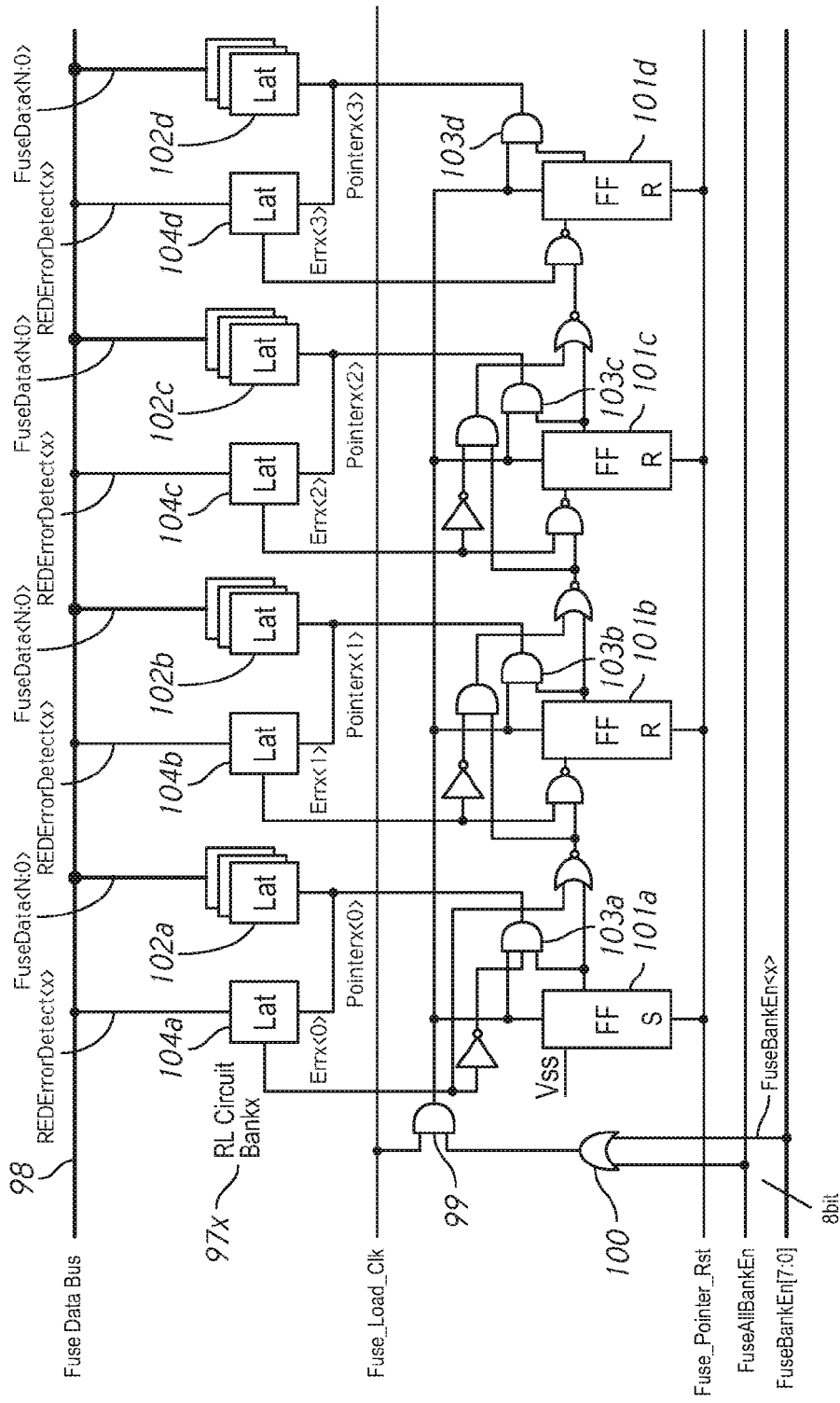
FIG. 9B is a circuit diagram of a redundancy latch (RL) circuit Bankx of redundancy latch circuits (RLs) in the redundancy data loading/transmitting circuit, in accordance with an embodiment of the present disclosure.

FIG. 9B is a circuit diagram of a redundancy latch (RL) circuit Bankx 97x of redundancy latch (RL) circuits 97a to 97h in the redundancy data loading/transmitting circuit 90, in accordance with an embodiment of the present disclosure. Description of components in FIG. 9B corresponding to components included in FIG. 7D previously described, such as latches 102a to 102d corresponding to the latches 72a to 72d and a plurality of logic gates 103a to 103d corresponding to the plurality of logic gates 33a to 33d, will not be repeated. However, in contrast to the redundancy latch (RL) circuit Bankx 77x of FIG. 7D, the redundancy latch (RL) circuit Bankx 97x may further include error detect latches 104a to 104d and a logic gate 100. The logic gate 100 may receive the all bank fuse enable signal FuseAllBankEn and a corresponding bank enable bit FuseBankEn<x> and may further provide an active output signal to a logic gate 99, if at least one of the all bank fuse enable signal FuseAllBankEn and the corresponding bank enable bit FuseBankEn<x> is active. Thus, the reference clock signal Fuse_Load_Clk may be provided to the FFs 101a to 101d when Bankx is addressed for latching data on the Fuse Data Bus 98.

Figures 9C, 9D:
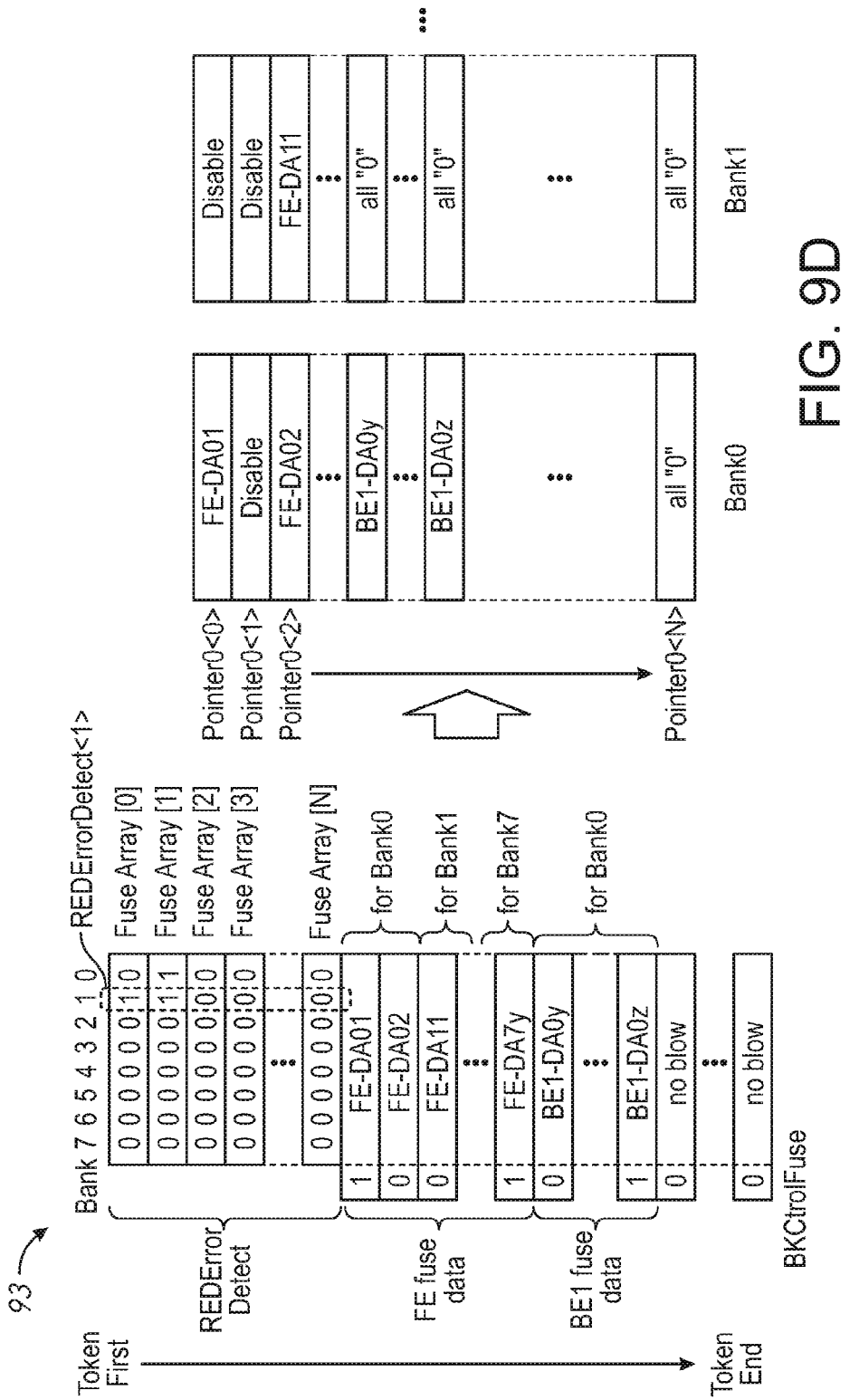
FIG. 9C is a schematic diagram of a data structure of the fuse array circuit in the redundancy data loading/transmitting circuit, in accordance with an embodiment of the present disclosure.
FIG. 9D is a schematic diagram of fuse data latched in respective redundancy latch circuits (RLs) in the redundancy data loading/transmitting circuit, corresponding to FIG. 9C.

FIG. 9C is a schematic diagram of a data structure of the fuse array circuit 93 in the redundancy data loading/transmitting circuit 90, in accordance with an embodiment of the present disclosure. FIG. 9D is a schematic diagram of fuse data latched in respective redundancy latch circuits (RLs) 97x in the redundancy data loading/transmitting circuit 90, corresponding to FIG. 9C. The fuse array circuit 93 may store the redundant error detection information (REDErrorDetect) in addition to defective addresses (DAs) and bank control fuse bits BKCtrlFuse described in FIGS. 8A, 8B and 8D. For example, the fuse array circuit 93 may include fuse arrays [0:N] for storing the redundant error detection information (REDErrorDetect) for Pointerx<0> to Pointerx<N> respectively, where N is a number of Pointers in each bank and "x" is a positive integer (x≥0) which identifies Bankx. The redundant error detection information (REDErrorDetect) may be activated (e.g., set to "1") when a cell for redundancy data is defective, and a corresponding error detect latch of the error detect latches 104a to 104d may provide error signal errx<0> responsive to a corresponding redundant error detection information (REDErrorDetect) <x>. If the latched redundant error detection information (REDErrorDetect) <x> is active, indicating of the defective cell for redundancy data, a corresponding pointer may be skipped and the defect cell for redundancy data may be disabled.

For example, a fuse array [0] may store redundant error detection information (REDErrorDetect) including a bit for Bank1 active (e.g., "1"). Responsive to the bit for Bank1 of redundant error detection information in the fuse array [0], a latch 104a for a cell for redundancy data corresponding to Pointer1<0> for Bank1 may be disabled as shown in FIG. 9D. Responsive to active bits of redundant error detection information (REDErrorDetect) for Bank1 and Bank0 in a fuse array [1], a latch 104b for a cell for redundancy data corresponding to Pointer1<1> for Bank1 and a latch 104b for a cell for redundancy data corresponding to Pointer0<1> for Bank0 may be disabled as shown in FIG. 9D. Fuse arrays [2, 3, . . . N] may not include any active bit in redundant error detection information (REDErrorDetect), and all bank pointers may be enabled.

The redundant error detection information (REDErrorDetect)<x> may be loaded prior to loading fuse data including defective addresses (DAs) and bank control fuse bits BKCtrlFuse as shown in FIG. 9C. Thus, the redundant error detection information (REDErrorDetect)<x> may be provided to the redundancy latch (RL) circuit Bankx 97x prior to defective addresses (DAs). In loading the redundant error detection information (REDErrorDetect), the latches 102a to 102d of the banks may be activated responsive to an active all bank fuse enable signal FuseAllBankEn (e.g., "1") to latch the REDErrorDetect<x> for all banks. The error detect latches 104a to 10d in the redundancy latch (RL) circuit Bankx 97x may provide a corresponding error signal of error signals Errx<0> to Errx<3> responsive to the REDErrorDetect<x> and a corresponding pointer signal of Pointerx<0> to Pointerx<3>. For example, when one Errx<0> may be activated (e.g., set to "1") and a reversed signal of the Errx<0> may be provided to a logic gate 103a to deactivate a corresponding Pointerx<0>, and a corresponding latch 102a may be disabled responsive to the deactivated Pointerx<0>. Thus, at loading the fuse data, including defective addresses (DAs) and enable bits (EBs), the latches 102a to 102d may be activated or deactivated responsive to the bank enable bit FuseBankEn<x>, responsive to the error signals Errx<0> to Errx<3>, and redundancy data from defective cells may not be loaded to corresponding latches of the deactivated latches 102a to 102d in the redundancy latch (RL) circuit Bankx 97x.

Figure 9E:
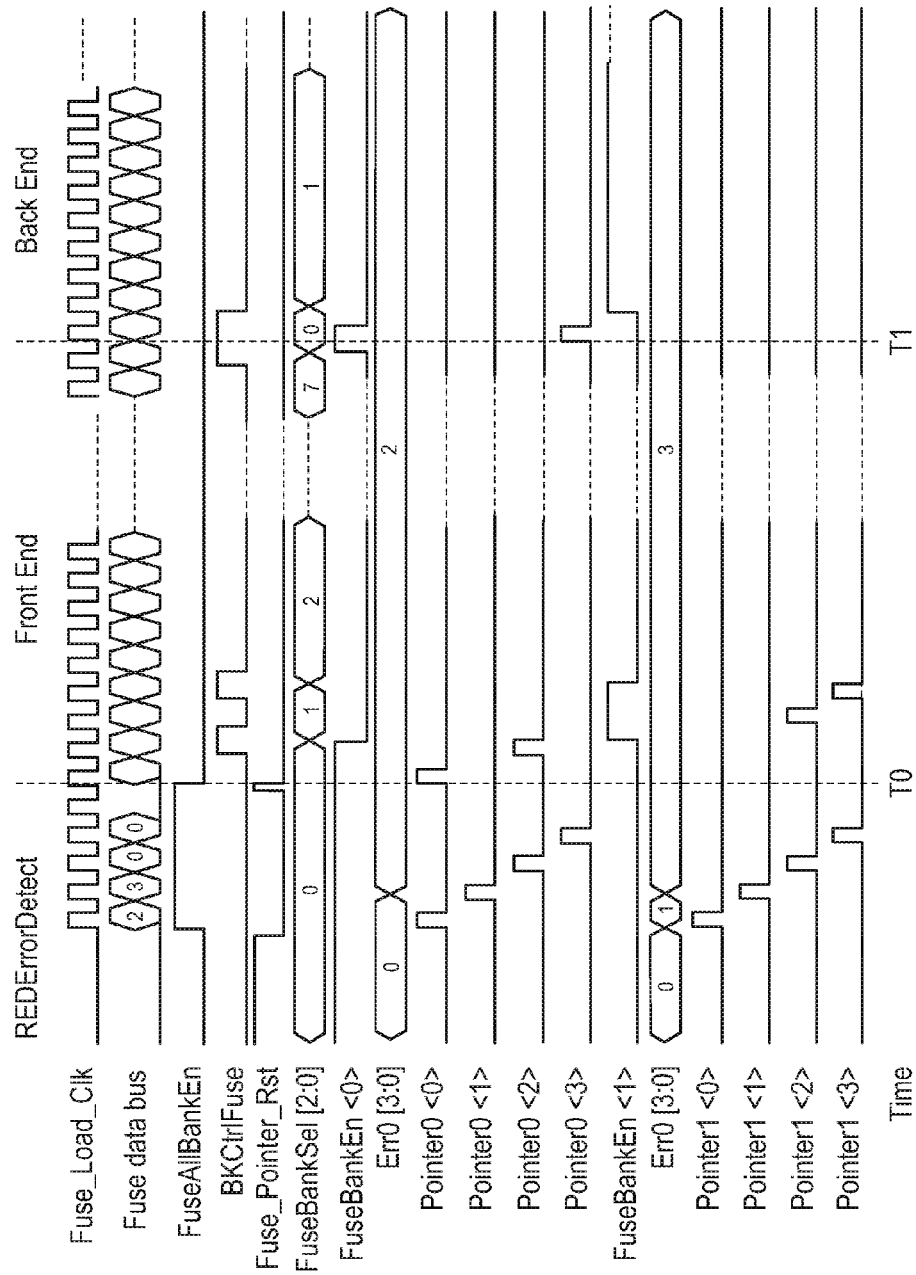
FIG. 9E is a timing diagram of signals in the redundancy data loading/transmitting circuit, corresponding to FIGS. 9A to 9D.

FIG. 9E is a timing diagram of signals in the redundancy data loading/transmitting circuit 90, corresponding to FIGS. 9A to 9D. Prior to loading defective addresses detected by the test in the manufacturing (front end [FE]) process, the all bank fuse enable signal FuseAllBankEn may be activated and the redundant error detection information (REDErrorDetect) may be loaded. For example, first data "2" on the fuse data bus after an activation of the all bank fuse enable signal FuseAllBankEn corresponds to the fuse array [0] in FIG. 9C. Responsive to the first data "2", Err[0] indicates "2". Preceded by the first data "2", second data "3" on the fuse data bus corresponds to the fuse array [1] in FIG. 9C. Responsive to the second data "3", Err[1] indicates "3". Responsive to a one shot pulse signal of Fuse_Pointer_Rst signal, fuse data from the test in the manufacturing (front end [FE]) process may be loaded. Here, the bank enable bit FuseBankEn<0> may be activated at T0. Based on Err[O] indicating "2", the Pointer0<1> may not be deactivated (e.g., maintain "0" level). Preceded by an active bank control fuse bit BKCtrlFuse signal, the bank enable bit FuseBankEn<1> may be activated and the fuse data bus 98 may provide data for Bank1. Based on Err[1] indicating "3", the Pointer1<0> and Pointer1<1> may not be activated (e.g., maintain "0" level). Thus, loading redundancy data to redundancy latches from defective cells may be disabled pointer by pointer.

Figure 10A:
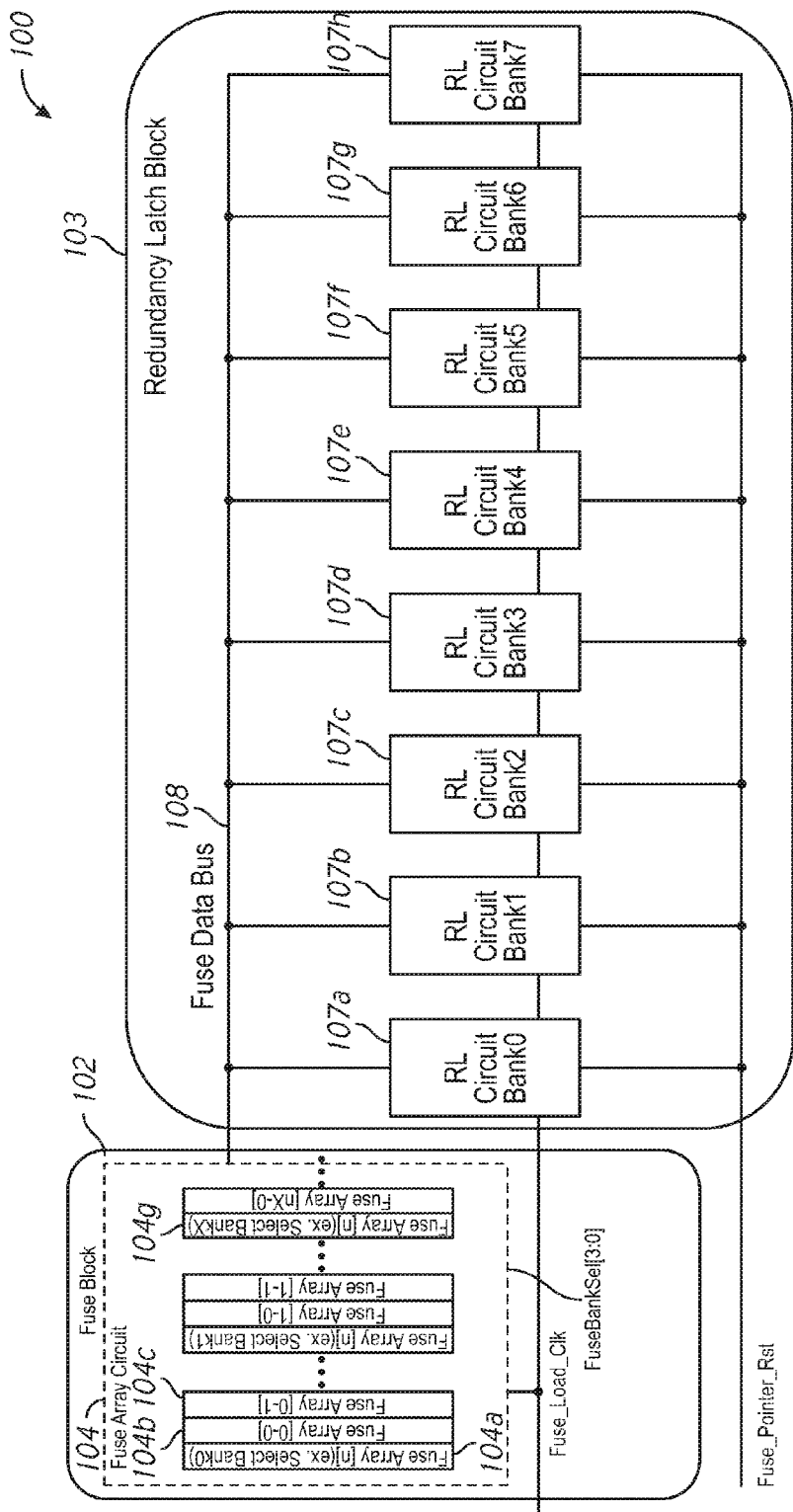
FIG. 10A is a block diagram of a redundancy data loading/transmitting circuit in a semiconductor device, in accordance with an embodiment of the present disclosure.

FIG. 10A is a block diagram of a redundancy data loading/transmitting circuit 100 in a semiconductor device, in accordance with an embodiment of the present disclosure. For example, the redundancy data loading/transmitting circuit 100 may include a fuse block 102 and a redundancy latch block 103. The fuse block 102 may include a fuse array circuit 104 including a plurality of fuse arrays [0:n] 104a to 104g. Each of the fuse arrays 104a to 104g may include a plurality of fuses. The redundancy latch block 103 may include a plurality of redundancy latch (RL) circuits 107a to 107h coupled in series for a plurality of respective banks (e.g., Bank0 to Bank7).

Figures 10B, 10C:
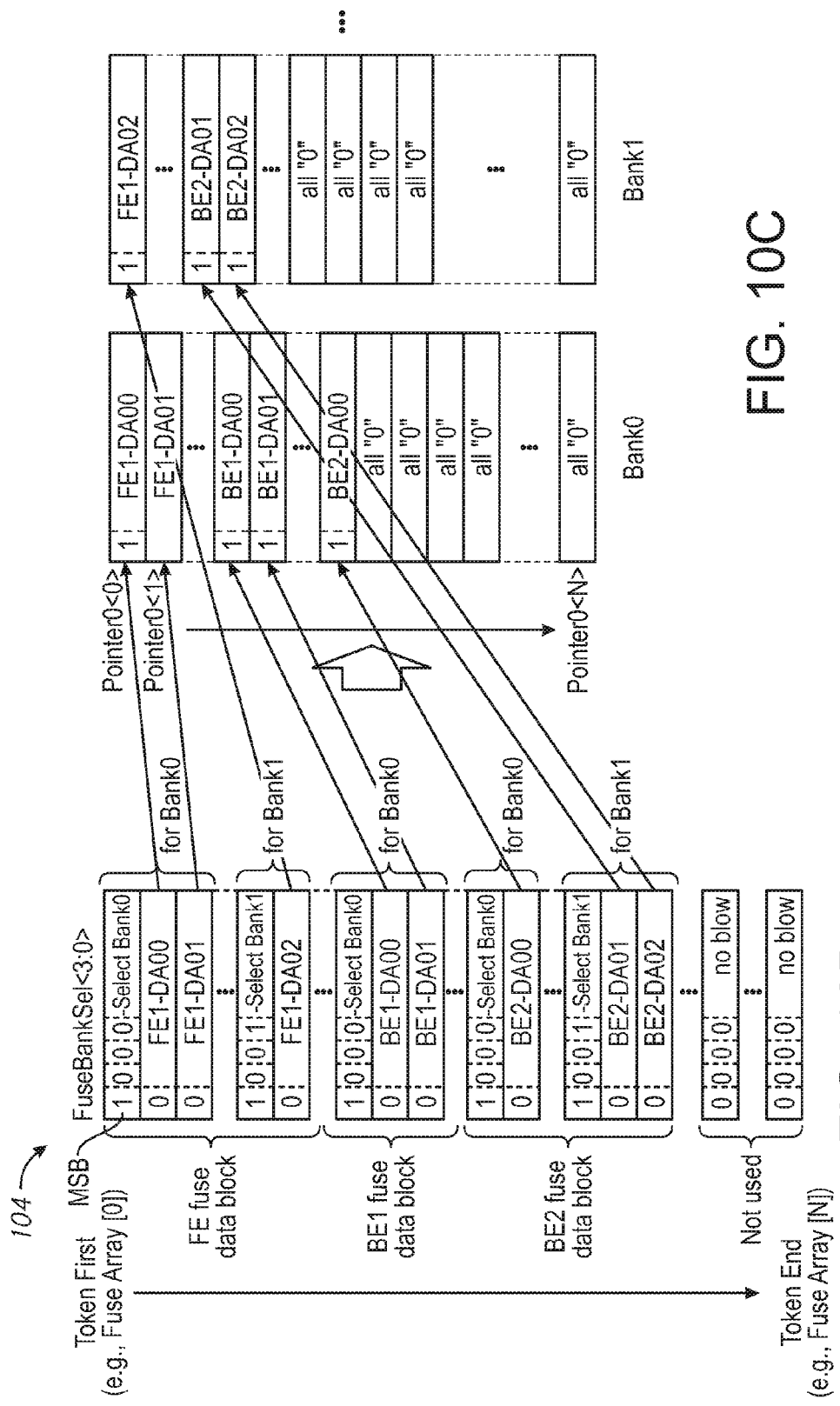
FIG. 10B is a schematic diagram of a data structure of the fuse array circuit in the redundancy data loading/transmitting circuit, in accordance with an embodiment of the present disclosure.
FIG. 10C is a schematic diagram of fuse data latched in respective redundancy latch circuits (RLs) in the redundancy data loading/transmitting circuit, corresponding to FIG. 10B.

FIG. 10B is a schematic diagram of a data structure of the fuse array circuit 104 in the redundancy data loading/transmitting circuit 100, in accordance with an embodiment of the present disclosure. The fuse array circuit 104 may include a plurality of first tokens (e.g., bank select tokens: Select Bankx, x being 0 to 7). Each of the plurality of first tokens may store bank select data designating a bank into which fuse data are to be loaded/transferred. For example, the most significant bit (MSB) of each of the plurality of first tokens may be programmed with "1" to indicate that this token is subject to bank selection, and the succeeding three bits are stored with the bank select data indicating information of the bank to be selected. The fuse array circuit 104 may further include a plurality of second tokens (e.g., defective address tokens). Each of the plurality of second tokens may store a defective address (DA) including a row address and a column address of a defective cell. For example, the defective address (DA) may be a defective address FE-DAxy (x represents the bank ID represented by the plurality of bank selection token, y represents an order in Bankx) detected by a test in a manufacturing (e.g., front end [FE]) process. The defective address (DA) may be a defective address BEn-DAxy detected by a test in a packaging process (Post Package Repair [PPR]/Back End [BE]), where n is a BE test ID associated with a test in the packaging process in which the defective address is detected. For example, the y-th defective address in Bankx in a first test in the packaging process may be identified as BE1-DAxy. The y-th defective address in Bankx in a second test in the packaging process may be identified as BE2-DAxy. For example, the MSB of each of the second tokens for defective addresses may indicate "0" in order to differentiate it from the first tokens for bank selection. Each of the first tokens and the second tokens may have n-bits (for example, n may be, but not limited to, 16), and may be read out from the fuse array circuit 104 and transferred onto a fuse data bus 108 in FIG. 10A, in response to each rising edge of the reference clock signal Fuse_Load_Clk.

Figure 10D:
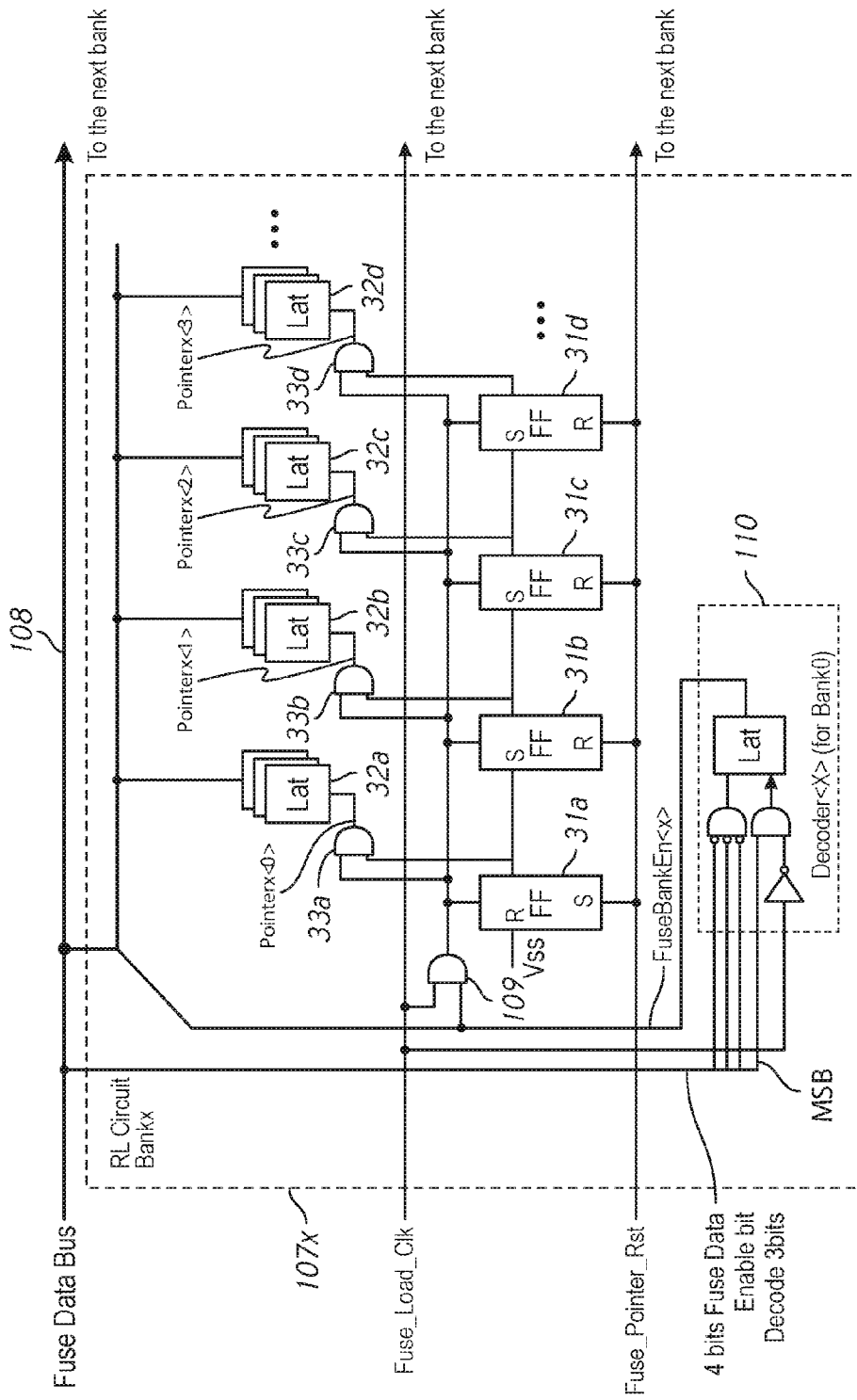
FIG. 10D is a circuit diagram of a redundancy latch (RL) circuit Bankx of redundancy latch circuits (RLs) in the redundancy data loading/transmitting circuit, in accordance with an embodiment of the present disclosure.
Figure 10E:
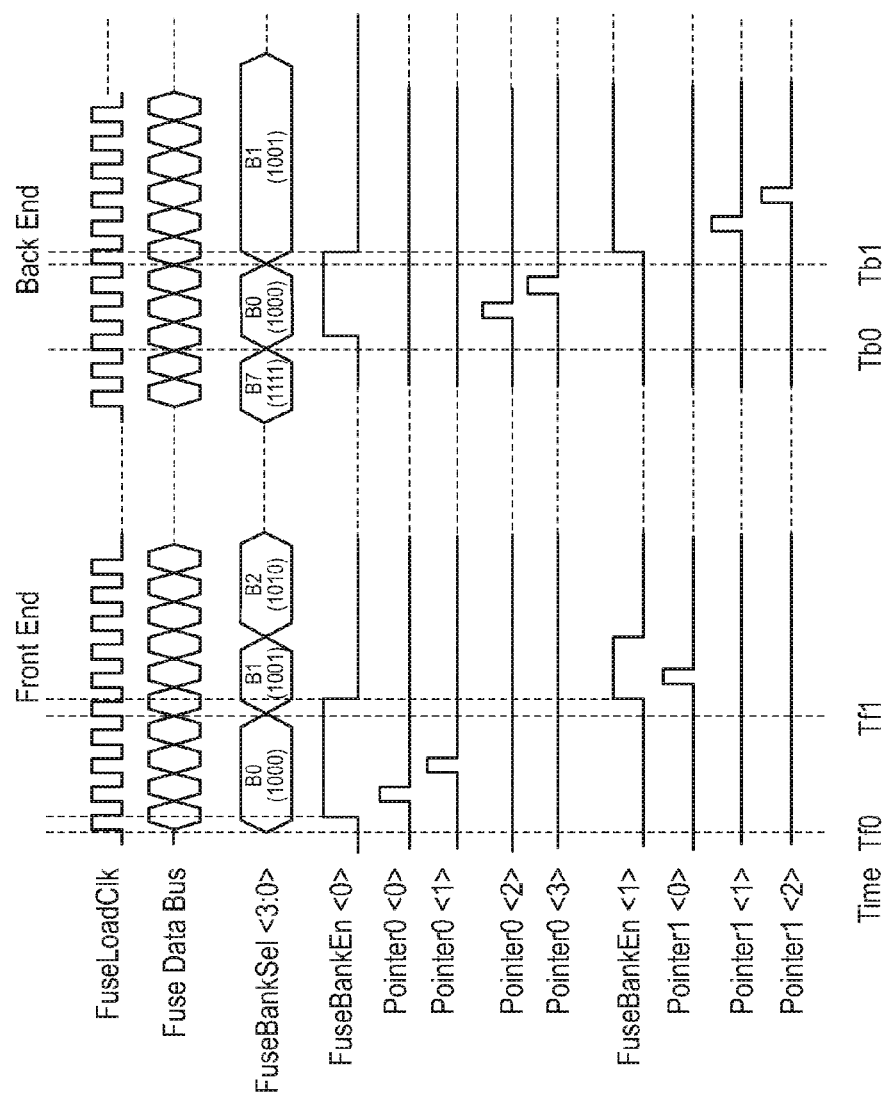
FIG. 10E is a timing diagram of signals in the redundancy data loading/transmitting circuit, corresponding to FIGS. 10A to 10D.

FIG. 10C is a schematic diagram of fuse data latched in respective redundancy latch circuits (RLs) in the redundancy data loading/transmitting circuit, corresponding to FIG. 10B. FIG. 10D is a circuit diagram of a redundancy latch (RL) circuit Bankx of redundancy latch circuits (RLs) in the redundancy data loading/transmitting circuit, in accordance with an embodiment of the present disclosure. FIG. 10E is a timing diagram of signals in the redundancy data loading/transmitting circuit, corresponding to FIGS. 10A to 10D.

Each redundancy latch (RL) circuit 107x for BankX (X being 0 to 7), such as the redundancy latch circuits 107a to 107h in FIG. 10A, may include a decoder 110. For example, the decoder<X> 110 shown in FIG. 10D is for Bank0. Of the n-bits fuse data on the fuse data bus 108, more significant four bits (e.g., FuseBankSel<3:0>) including MSB may be provided to the decoders 110 of the respective Bank0-Bank7. The decoder<X>110 for Bank0 may set a bank enable bit FuseBankEn<0> as FuseBankEn <X> to an active level (e.g., a logic high level) in response to a falling edge of the reference clock signal Fuse_Load_Clk. As the active level is also used for an enable bit for the respective defective addresses, the bank enable bit FuseBankEn<0> is merged with (n−1)-bits data (e.g., except the MSB) on the fuse data bus 108. As a result, all the FE defective addresses following the bank select token for Bank0 (Select Bank0) are loaded in sequence into the redundancy latch circuits 107x (e.g., the redundancy latch circuit of Bank0 107a), as shown in FIGS. 10C and 10E.

When a bank select token for Bank1 is read out from the fuse array circuit 102, the bank enable bit FuseBankEn<0> is set to an inactive level (e.g., a logic low level), and a bank enable bit FuseBankEn<1> in Bank1 is set to the active level by the decoder 110 of Bank1. The above mentioned operations are thus performed for respective FE defective addresses for Bank1 as well as for the remaining Bank2 to Bank7.

When the bank select token for Bank0 is read out again from the fuse array circuit 102 for BE1 defective addresses, the bank enable bit FuseBankEn<0> may be set to the inactive level. At this time, a location of a pointer is shifted to a logic gate 33c to provide a signal from a FF 31c, and defective addresses BE1-DA00 and BE1-DA01 are latched into latches 32c and 32d, respectively. Thus, FE defective addresses detected in a manufacturing process, and defective addresses detected in a plurality of tests in a packaging process, such as BE defective addresses and BE2 defective addresses may be loaded to the respective Bank0 to Bank7.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a data bus; and
   a first circuit block coupled to the data bus, wherein the first circuit block comprises:
   a plurality of latch circuits, each of the plurality of latch circuits being coupled to the data bus and configured, when activated, to latch information on the data bus;
   a pointer circuit configured to activate a different one of the plurality of latch circuits each time the pointer circuit receive a load clock pulse;
   a circuit node supplied with a control signal, the control signal is configured to be at an active level when the first circuit block is selected and at an inactive level when the first circuit block is not selected; and
   a gate circuit coupled to receive the load clock pulse and the control signal, the gate circuit being configured to be allowed to supply the load clock pulse to the pointer circuit responsive to the control signal being at the active level and prevented from supplying the load clock pulse to the pointer circuit responsive to the control signal being at the inactive level.

2. The apparatus of claim 1, further comprising:
   a second circuit block configured to provide a string of first data to the data bus, the second circuit block being further configured to provide a string of second data in association respectively with the string of first data, at least one of the string of second data having a first state, and remaining one or ones of the string of second data having a different state from the first state; and
   a decoder circuit configured to decode each of the string of second data, the decoder circuit being further configured to set the control signal at the active level responsive to the at least one of the string of second data having the first state and at the inactive level responsive to the remaining one or ones of the string of second data having the different state.

3. The apparatus of claim 2, wherein the second circuit block comprises a fuse array circuit, the fuse array circuit comprising a plurality of fuse arrays, each of the plurality of fuse arrays being configured to store in pair defective address information as the first data and bank select information as the second data, the fuse array circuit being configured to access each of the plurality of fuse arrays to provide the defective address information and the bank select information in pair.

4. The apparatus of claim 3, wherein the plurality of fuse arrays includes a first fuse array and a second fuse array, the first fuse array being configured to store first defective address information and first bank select information, the second fuse array being configured to store second defective address information and second bank select information, and the first bank select information having the first state and the second bank select information having the different state so that the first defective address information is latched in a first latch circuit of the plurality of latch circuits of the first circuit block and the second defective address information is not latched any one of the plurality of latch circuits of the first circuit block.

5. The apparatus of claim 4, wherein the plurality of fuse arrays further includes a third fuse array, the third fuse array being configured to store third defective address information and first bank select information so that the third defective address information is latched in a second latch circuit of the plurality of latch circuits of the first circuit block.

6. The apparatus of claim 1,
wherein the first circuit block further comprises a plurality of flag latches provided correspondingly to the plurality of latch circuits, each of the flag latches being configured to store one of first flag information and second flag information, the first flag information indicating that an associated latch circuit is valid, and the second flag information indicating that the associated latch circuit is invalid;
wherein the pointer circuit is further configured to be disabled from activating one or ones of the plurality of latch circuits indicated as being invalid by the second flag information stored in corresponding one or ones of the plurality of flag latches, irrespective of the pointer circuit receiving the load clock pulse.

7. The apparatus of claim 6, wherein each of the plurality of flag latches is coupled to the data bus and configured, when activated, to store one of the first flag information and the second flag information through the data bus.

8. The apparatus of claim 7, wherein the pointer circuit is further configured to activate each of the plurality of flag latches prior to activating any one of the plurality of latch circuits.

9. The apparatus of claim 1,
wherein the apparatus further comprises a second circuit block configured to provide a first data to the data bus, the second circuit block being further configured to provide a string of second data to the data bus after providing the first data, and the first data having one of a first state and a different state from the first state, and
wherein the first circuit block further comprises a decoder circuit configured to decode the first data, the decoder circuit being further configured to set the control signal at the active level responsive to the first data having the first state and at the inactive level responsive to the first data having the different state.

10. The apparatus of claim 9, wherein the decoder circuit is further configured, responsive to the first data having the first state, to keep the control signal at the active level at least until each of the string of second data is latched in an associated one of the plurality of latch circuits of the first circuit block.

11. The apparatus of claim 10, wherein the second circuit block comprises a fuse array circuit, the fuse array circuit comprising a first fuse array and a plurality of second fuse arrays, the first fuse array being configured to store bank select information, each of the second fuse arrays being configured to store defective address information, and the fuse array circuit being configured to access the first fuse array and then further access each of the plurality of second fuse arrays to provide the data bus with the first data as the bank select information and with the string of second data each as the defective address information.

12. The apparatus of claim 11, wherein the bank select information stored in the first fuse array has the first state so that the defective address information stored in each of the plurality of second fuse arrays is latched in an associated one of the plurality of latch circuits of the first circuit block.

13. The apparatus of claim 12, wherein each of the plurality of latch circuits is further coupled to the circuit node so that the defective address information stored in each of the plurality of second fuse arrays is latched in an associated one of the plurality of latch circuits of the first circuit block together with the active level of the control signal.

14. The apparatus of claim 11, wherein the bank select information stored in the first fuse array has the different state so that the defective address information stored in any one of the plurality of second fuse arrays is prevented from being latched in any one of the plurality of latch circuits of the first circuit block.

15. An apparatus comprising:
a fuse data bus;
a fuse block configured to provide a first string of defective address information to the fuse data bus;
a first redundant circuit block coupled to the fuse data bus; and
a second redundant circuit block coupled to the fuse data bus;
wherein the first redundant circuit block comprises:
a plurality of first latch circuits, each of the plurality of first latch circuits being coupled to the fuse data bus and configured, when activated, to latch information on the fuse data bus,
a first pointer circuit configured to activate a different one of the plurality of first latch circuits each time the first pointer circuit receive a load clock pulse,
a first circuit node supplied with a first control signal, the first control signal is configured to be at an active level when the first redundant circuit block is selected and at an inactive level when the first redundant circuit block is not selected, and
a first gate circuit coupled to receive the load clock pulse and the first control signal, the first gate circuit being configured to be allowed to supply the load clock pulse to the first pointer circuit responsive to the first control signal being at the active level and prevented from supplying the load clock pulse to the first pointer circuit responsive to the first control signal being at the inactive level; and
wherein the second redundant circuit block comprises:
a plurality of second latch circuits, each of the plurality of second latch circuits being coupled to the fuse data bus and configured, when activated, to latch information on the fuse data bus,
a second pointer circuit configured to activate a different one of the plurality of second latch circuits each time the second pointer circuit receive the load clock pulse,
a second circuit node supplied with a second control signal, the second control signal is configured to be at an active level when the second redundant circuit block is selected and at an inactive level when the second redundant circuit block is not selected, and
a second gate circuit coupled to receive the load clock pulse and the second control signal, the second gate circuit being configured to be allowed to supply the load clock pulse to the second pointer circuit responsive to the second control signal being at the active level and prevented from supplying the load clock pulse to the second pointer circuit responsive to the second control signal being at the inactive level.

16. The apparatus of claim 15,
wherein the fuse block is further configured to provide the fuse data bus with a first string of block select information in association respectively with the first string of defective address information, the first string of block select information including first block select information for selecting the first redundant circuit block and second block select information for selecting the second redundant circuit block; and
wherein the fuse block comprises a decoder configured to decode each of the first string of block select information to set the first control signal at the active level responsive to the first block select information and set the second control signal at the active level responsive to the second block select information.

17. The apparatus of claim 16, wherein the fuse block comprises a plurality of fuse arrays, each of the plurality of fuse arrays being configured to store defective address information and block select information in pair, and the fuse block being further configured to access each of the plurality of fuse arrays to provide the fuse data bus with the first string of defective address information and the first string of block select information associated respectively with the first string of defective address information.

18. The apparatus of claim 15,
wherein the fuse block is further configured to provide the fuse data bus with first block select information, second block select information and a second string of defective address information, the first block select information being provided before the first string of defective address information, the second block select information being provided after the first string of defective address information, and the second string of defective address information being provided after the second block select information;
wherein the first redundant circuit block further comprises a first decoder coupled to the fuse data bus and configured to decode the first block select information to set the first control signal at the active level so that each of the first string of defective address information is latched in a corresponding one of the plurality of first latch circuits; and
wherein the second redundant circuit block further comprises a second decoder coupled to the fuse data bus and configured to decode the second block select information to set the second control signal at the active level so that each of the second string of defective address information is latched in a corresponding one of the plurality of second latch circuits.

19. The apparatus of claim 18, wherein the fuse block comprises a first fuse array, a plurality of second fuse arrays, a third fuse array and a plurality of fourth fuse arrays, the first fuse array being configured to store the first block select information, each of the plurality of second fuse arrays being configured to store a corresponding one of the first string of defective address information, the third fuse array being configured to store the second block select information, each of the plurality of fourth fuse arrays being configured to store a corresponding one of the second string of defective address information, and the fuse block being further configured to successively access the first fuse array, the plurality of second fuse arrays, the third fuse array and the plurality of fourth fuse arrays.

20. The apparatus of claim 18,
wherein each of the plurality of first latch circuits is coupled to the first circuit node so that each of the first string of defective address information is latched in a corresponding one of the plurality of first latch circuits together with the active level of the first control signal; and
wherein each of the plurality of second latch circuits is coupled to the second circuit node so that each of the second string of defective address information is latched in a corresponding one of the plurality of second latch circuits together with the active level of the second control signal.

* * * * *